(12) United States Patent
Yang et al.

(10) Patent No.: US 11,322,092 B2
(45) Date of Patent: May 3, 2022

(54) DISPLAY SUBSTRATE AND DISPLAY PANEL

(71) Applicant: BOE TECHNOLOGY GROUP CO., LTD., Beijing (CN)

(72) Inventors: Shengji Yang, Beijing (CN); Xiaochuan Chen, Beijing (CN); Hui Wang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 16/959,858

(22) PCT Filed: Aug. 30, 2019

(86) PCT No.: PCT/CN2019/103799
§ 371 (c)(1),
(2) Date: Jul. 2, 2020

(87) PCT Pub. No.: WO2021/035716
PCT Pub. Date: Mar. 4, 2021

(65) Prior Publication Data
US 2021/0407418 A1    Dec. 30, 2021

(51) Int. Cl.
*G09G 3/3258*    (2016.01)
*H01L 27/32*     (2006.01)
*H01L 51/52*     (2006.01)

(52) U.S. Cl.
CPC ....... *G09G 3/3258* (2013.01); *H01L 27/3223* (2013.01); *H01L 27/3262* (2013.01);
(Continued)

(58) Field of Classification Search
CPC ............... G09G 3/3258; G09G 3/3233; G09G 2300/0413; G09G 2300/0842
See application file for complete search history.

(56) References Cited

U.S. PATENT DOCUMENTS 9,029,969 B2   5/2015   Endo
10,453,396 B2  10/2019  Koong
(Continued)

FOREIGN PATENT DOCUMENTS

CN    103022065 A    4/2013
CN    108022553 A    5/2018
(Continued)

*Primary Examiner* — Kevin M Nguyen
(74) *Attorney, Agent, or Firm* — Scully Scott Murphy & Presser

(57) ABSTRACT

A display substrate and a display panel are provided. The display substrate includes a base substrate, and the base substrate includes a display region, a sensing region, and a dummy region; a plurality of sensing pixel units including a first light emitting element and a first pixel circuit are provided in the sensing region, and the first pixel circuit controls a voltage sensor to sense a voltage at a first terminal of the first light emitting element; a plurality of display pixel units including a second pixel circuit and a second light emitting element are provided in the display region; a plurality of dummy pixel units including a third pixel circuit and a third light emitting element are provided in the dummy region; and the first light emitting element, the second light emitting element, and the third light emitting element are all connected to a common voltage terminal.

20 Claims, 9 Drawing Sheets

(52) U.S. Cl.
 CPC . *H01L 51/5284* (2013.01); *G09G 2300/0413* (2013.01); *G09G 2300/0842* (2013.01)

(56) References Cited

U.S. PATENT DOCUMENTS

| | | | | |
|---|---|---|---|---|
| 2011/0080437 | A1* | 4/2011 | Yamashita | G09G 3/3233 |
| | | | | 345/690 |
| 2014/0240372 | A1* | 8/2014 | Pak | G09G 3/3275 |
| | | | | 345/690 |
| 2016/0012767 | A1* | 1/2016 | Nebon | G09G 3/3275 |
| | | | | 345/82 |
| 2019/0015011 | A1 | 1/2019 | Kim et al. | |

FOREIGN PATENT DOCUMENTS

| | | |
|---|---|---|
| CN | 109255285 A | 1/2019 |
| CN | 109285492 A | 1/2019 |
| CN | 110109288 A | 8/2019 |
| JP | 2011-064880 A | 3/2011 |

\* cited by examiner

DISPLAY SUBSTRATE AND DISPLAY PANEL

CROSS-REFERENCE TO RELATED APPLICATIONS

This application is a national phase entry of PCT International Application No. PCT/CN2019/103799, filed on Aug. 30, 2019. The disclosure of PCT International Application No. PCT/CN2019/103799 is incorporated by reference herein.

TECHNICAL FIELD

Embodiments of the present disclosure relate to a display substrate and a display panel.

BACKGROUND

Silicon-based organic light emitting diode (OLED) micro display is an emerging branch of a display industry, and the silicon-based OLED micro display is a new display technology that combines OLED technology and CMOS (Complementary Metal Oxide Semiconductor) technology. A silicon-based OLED micro display device uses a single-crystal silicon chip as a base, a pixel size is small, and the fineness is much higher than that of a traditional display device. The silicon-based OLED micro display device has a broad market application space, and is especially suitable for helmet-mounted displays, stereoscopic displays, eye-type displays, and the like.

SUMMARY

At least one embodiment of the present disclosure provides a display substrate comprising a base substrate, the base substrate is a silicon substrate and comprises a display region, a sensing region, and a dummy region; at least part of the dummy region is between the display region and the sensing region; a plurality of sensing pixel units are provided in the sensing region, at least one of the plurality of sensing pixel units comprises a first light emitting element and a first pixel circuit, and the first pixel circuit is connected to a first terminal of the first light emitting element and a voltage sensor, and is configured to drive the first light emitting element to emit light and control the voltage sensor to sense a voltage at the first terminal of the first light emitting element; a plurality of display pixel units are provided in the display region, at least one of the plurality of display pixel units comprises a second pixel circuit and a second light emitting element, and the second pixel circuit is connected to a first terminal of the second light emitting element, and is configured to drive the second light emitting element to emit light to display an image; a plurality of dummy pixel units are provided in the dummy region, at least one of the plurality of dummy pixel units comprises a third pixel circuit and a third light emitting element, the third pixel circuit is identical to the second pixel circuit, the third light emitting element is identical to the second light emitting element, and the third pixel circuit is not connected to the third light emitting element; and a second terminal of the first light emitting element, a second terminal of the second light emitting element, and a second terminal of the third light emitting element form an integrated structure; the integrated structure is connected to a common voltage terminal and the integrated structure at least covers the display region, the sensing region, and the at least part of the dummy region between the display region and the sensing region.

For example, in the display substrate provided by the embodiments of the present disclosure, the first pixel circuit comprises a first data writing circuit, a first driving circuit, and a first storage circuit; the first data writing circuit is connected to a control terminal of the first driving circuit, and is configured to write a first data signal to the control terminal of the first driving circuit under control of a first scan signal; a second terminal of the first driving circuit is connected to the first terminal of the first light emitting element, and the first driving circuit is configured to drive the first light emitting element to emit light under control of a voltage applied to the control terminal of the first driving circuit; and the first storage circuit is connected to the control terminal of the first driving circuit, and is configured to store the first data signal and hold the first data signal at the control terminal of the first driving circuit; and the second pixel circuit comprises a second data writing circuit, a second driving circuit, and a second storage circuit; the second data writing circuit is connected to a control terminal of the second driving circuit, and is configured to write a second data signal to the control terminal of the second driving circuit under control of a second scan signal; a second terminal of the second driving circuit is connected to the first terminal of the second light emitting element, and the second driving circuit is configured to drive the second light emitting element to emit light under control of a voltage applied to the control terminal of the second driving circuit; and the second storage circuit is connected to the control terminal of the second driving circuit, and is configured to store the second data signal and hold the second data signal at the control terminal of the second driving circuit.

For example, in the display substrate provided by the embodiments of the present disclosure, the first pixel circuit further comprises a first reset circuit; the first reset circuit is connected to the first terminal of the first light emitting element and is configured to apply a first reset voltage to the first terminal of the first light emitting element under control of a first reset control signal to reset the first terminal of the first light emitting element; the second pixel circuit further comprises a second reset circuit; the second reset circuit is configured to reset the first terminal of the second light emitting element using a second reset voltage under control of a second reset control signal.

For example, in the display substrate provided by the embodiments of the present disclosure, the second reset circuit is connected to the first terminal of the second light emitting element, and is configured to apply the second reset voltage to the first terminal of the second light emitting element under control of the second reset control signal to reset the first terminal of the second light emitting element.

For example, in the display substrate provided by the embodiments of the present disclosure, the second reset circuit is connected to a first terminal of the second driving circuit, and is configured to apply the second reset voltage to the first terminal of the second driving circuit under control of the second reset control signal to reset the first terminal of the second light emitting element through the second driving circuit.

For example, in the display substrate provided by the embodiments of the present disclosure, the second pixel circuit further comprises a voltage control circuit, the voltage control circuit is connected to the first terminal of the second driving circuit, and is configured to apply a first voltage to the first terminal of the second driving circuit under control of a voltage control signal.

For example, in the display substrate provided by the embodiments of the present disclosure, the first data writing circuit comprises a first data writing transistor, the first driving circuit comprises a first driving transistor, the first storage circuit comprises a first storage capacitor, and the first reset circuit comprises a first reset transistor; the control terminal of the first driving circuit comprises a gate electrode of the first driving transistor, a first terminal of the first driving circuit comprises a first electrode of the first driving transistor, and the second terminal of the first driving circuit comprises a second electrode of the first driving transistor; a gate electrode of the first data writing transistor receives the first scan signal, a first electrode of the first data writing transistor receives the first data signal, and a second electrode of the first data writing transistor is connected to the gate electrode of the first driving transistor; a first terminal of the first storage capacitor is connected to the gate electrode of the first driving transistor, and a second terminal of the first storage capacitor is connected to the second electrode of the first driving transistor; and a gate electrode of the first reset transistor receives the first reset control signal, a first electrode of the first reset transistor receives the first reset voltage, and a second electrode of the first reset transistor is connected to the second electrode of the first driving transistor.

For example, in the display substrate provided by the embodiments of the present disclosure, the second data writing circuit comprises a second data writing transistor, the second driving circuit comprises a second driving transistor, the second storage circuit comprises a second storage capacitor, and the second reset circuit comprises a second reset transistor; the control terminal of the second driving circuit comprises a gate electrode of the second driving transistor, a first terminal of the second driving circuit comprises a first electrode of the second driving transistor, and the second terminal of the second driving circuit comprises a second electrode of the second driving transistor; a gate electrode of the second data writing transistor receives the second scan signal, a first electrode of the second data writing transistor receives the second data signal, and a second electrode of the second data writing transistor is connected to the gate electrode of the second driving transistor; a first terminal of the second storage capacitor is connected to the gate electrode of the second driving transistor, and a second terminal of the second storage capacitor is connected to the second electrode of the second driving transistor; and a gate electrode of the second reset transistor receives the second reset control signal, a first electrode of the second reset transistor receives the second reset voltage, and a second electrode of the second reset transistor is connected to the second electrode of the second driving transistor.

For example, in the display substrate provided by the embodiments of the present disclosure, the second data writing circuit comprises a second data writing transistor, the second driving circuit comprises a second driving transistor, the second storage circuit comprises a second storage capacitor, the second reset circuit comprises a second reset transistor, and the voltage control circuit comprises a voltage control transistor; the control terminal of the second driving circuit comprises a gate electrode of the second driving transistor, the first terminal of the second driving circuit comprises a first electrode of the second driving transistor, and the second terminal of the second driving circuit comprises a second electrode of the second driving transistor; a gate electrode of the second data writing transistor receives the second scan signal, a first electrode of the second data writing transistor receives the second data signal, and a second electrode of the second data writing transistor is connected to the gate electrode of the second driving transistor; a first terminal of the second storage capacitor is connected to the gate electrode of the second driving transistor, and a second terminal of the second storage capacitor is connected to a ground terminal; a gate electrode of the second reset transistor receives the second reset control signal, a first electrode of the second reset transistor receives the second reset voltage, and a second electrode of the second reset transistor is connected to the first electrode of the second driving transistor; and a gate electrode of the voltage control transistor receives the voltage control signal, a first electrode of the voltage control transistor receives the first voltage, and a second electrode of the voltage control transistor is connected to the first electrode of the second driving transistor.

For example, in the display substrate provided by the embodiments of the present disclosure, the first pixel circuit further comprises a sensing circuit; the sensing circuit is connected to the first terminal of the first light emitting element, and is configured to control the voltage sensor to sense the voltage at the first terminal of the first light emitting element under control of a sensing control signal.

For example, in the display substrate provided by the embodiments of the present disclosure, the sensing circuit comprises a sensing transistor, a gate electrode of the sensing transistor receives the sensing control signal, a first electrode of the sensing transistor is connected to the voltage sensor, and a second electrode of the sensing transistor is connected to the first terminal of the first light emitting element.

For example, in the display substrate provided by the embodiments of the present disclosure, the sensing region, the at least part of the dummy region, and the display region are sequentially arranged along a first direction; in the first direction, a size of the sensing region is between a size of the display region and a size of the at least part of the dummy region.

For example, the display substrate provided by the embodiments of the present disclosure further comprises an adjustment circuit, wherein the adjustment circuit is configured to adjust a voltage provided by the common voltage terminal based on the voltage, which is sensed, at the first terminal of the first light emitting element, a temperature of the display substrate, and a preset light emitting brightness.

For example, the display substrate provided by the embodiments of the present disclosure further comprises a light-shielding layer, wherein the light-shielding layer is at least disposed in the sensing region, and the light-shielding layer is on a side of the plurality of sensing pixel units away from the base substrate, and the light-shielding layer is configured to block light emitted from the sensing pixel unit in the sensing region.

For example, in the display substrate provided by the embodiments of the present disclosure, the light-shielding layer comprises a first light-shielding color film layer, a second light-shielding color film layer, and a third light-shielding color film layer, in a direction perpendicular to the base substrate, the first light-shielding color film layer, the second light-shielding color film layer, and the third light-shielding color film layer are sequentially arranged on a side away from the base substrate, an orthographic projection of an overlapping region of the first light-shielding color film layer, the second light-shielding color film layer, and the third light-shielding color film layer on the base substrate covers the sensing region; the plurality of display pixel units comprise a first display pixel unit, a second display pixel unit, and a third display pixel unit, the first display pixel unit comprises a first display color film layer, the second display pixel unit comprises a second display color film layer, and the third display pixel unit comprises a third display color film layer, the first light-shielding color film layer and the first display color film layer have same color filter characteristics, the second light-shielding color film layer and the second display color film layer have same color filter characteristics, and the third light-shielding color film layer and the third display color film layer have same color filter characteristics.

For example, in the display substrate provided by the embodiments of the present disclosure, the light-shielding layer comprises a black light-shielding layer, and in a direction perpendicular to the base substrate, an orthographic projection of the black light-shielding layer on the base substrate covers the sensing region.

For example, in the display substrate provided by the embodiments of the present disclosure, the light-shielding layer is further provided in the dummy region, the light-shielding layer is on a side of the plurality of dummy pixel units away from the base substrate, and the light-shielding layer is configured to block light emitted from the plurality of dummy pixel units of the dummy region.

For example, in the display substrate provided by the embodiments of the present disclosure, the first light emitting element is identical to or different from the second light emitting element; and the first pixel circuit is identical to or different from the second pixel circuit.

At least one embodiment of the present disclosure provides a display panel comprising the display substrate according to any one of the above embodiments.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
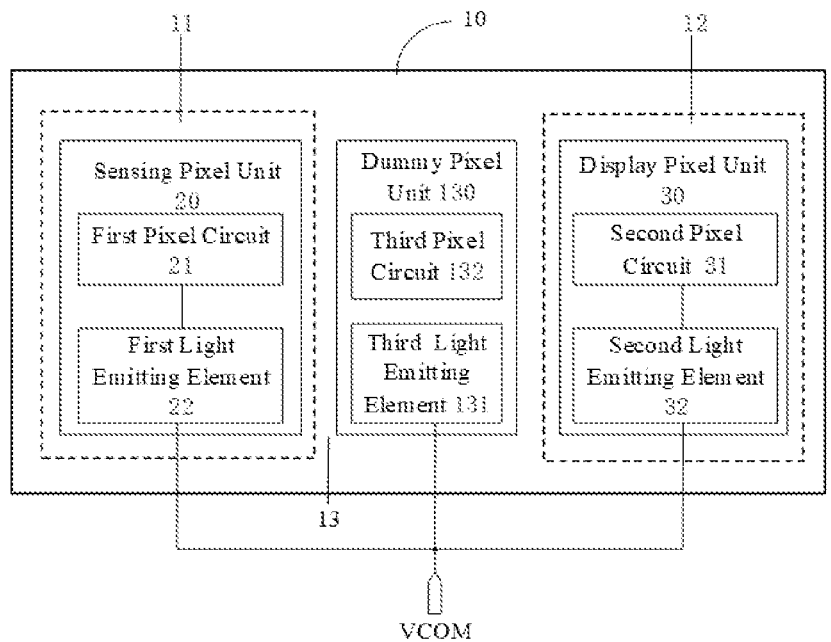
FIG. 1 is a schematic block diagram of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, detailed descriptions of some known functions and known components are omitted from the present disclosure.

An embodiment of the present disclosure provides a display substrate, the display substrate includes a base substrate, a plurality of display pixel units, and a plurality of sensing pixel units. The base substrate is a silicon substrate and includes a display region, a sensing region, and a dummy region, and at least part of the dummy region is located between the display region and the sensing region.

The plurality of sensing pixel units are provided in the sensing region, and at least one of the plurality of sensing pixel units includes a first light emitting element and a first pixel circuit. The first pixel circuit is connected to a first terminal of the first light emitting element and a voltage sensor, and is configured to drive the first light emitting element to emit light and to control the voltage sensor to sense a voltage at the first terminal of the first light emitting element.

The plurality of display pixel units are provided in the display region, and at least one of the plurality of display pixel units includes a second pixel circuit and a second light emitting element. The second pixel circuit is connected to a first terminal of the second light emitting element, and is configured to drive the second light emitting element to emit light to display an image.

A plurality of dummy pixel units are provided in the dummy region, and at least one of the plurality of dummy pixel units includes a third pixel circuit and a third light emitting element. The third pixel circuit is the same as the second pixel circuit, the third light emitting element is the same as the second light emitting element, and the third pixel circuit is not connected to the third light emitting element.

A second terminal of the first light emitting element, a second terminal of the second light emitting element and a second terminal of the third light emitting element form an integrated structure; the integrated structure is connected to a common voltage terminal and the integrated structure at least covers the display region, the sensing region, and the at least part of the dummy region between the display region and the sensing region.

The display substrate provided by the embodiment of the present disclosure can adjust the voltage provided by the common voltage terminal connected to the second terminal of the second light emitting element in the display pixel unit based on a temperature of the display substrate, a preset light emitting brightness, and the sensed voltage at the first terminal of the first light emitting element, so that the second light emitting element in the display pixel unit can reach the preset light emitting brightness under a certain temperature condition, and thus the display substrate can display the image information in the case where the gamma value is 2.2 in real time.

The embodiments of the present disclosure will be described in detail below with reference to the drawings, but the present disclosure is not limited to these specific embodiments.

FIG. 1 is a schematic block diagram of a display substrate provided by an embodiment of the present disclosure. As shown in FIG. 1, the display substrate includes a base substrate 10, a plurality of sensing pixel units 20, and a plurality of display pixel units 30. The base substrate 10 is a silicon substrate and includes a sensing region 11, a display region 12, and a dummy region 13. The plurality of sensing pixel units 20 are provided in the sensing region 11, and the plurality of display pixel units 30 are provided in the display region 12.

As shown in FIG. 1, the region on the base substrate 10 except for the sensing region 11 and the display region 12 is the dummy region 13, and the sensing region and the display region 12 are separated by at least a part of the dummy region 13. The dummy region 13 is provided to avoid short-circuiting of the component in the sensing region 11 and the component in the display region 12 that need to be insulated from each other, and to facilitate the packaging of the display substrate, which is beneficial to improve the packaging effect.

As shown in FIG. 1, at least one of the plurality of sensing pixel units 20 may include a first pixel circuit 21 and a first light emitting element 22. In the embodiment of the present disclosure, it may also be the case that each sensing pixel unit 20 includes a first pixel circuit 21 and a first light emitting element 22. The first pixel circuit 21 is connected to a first terminal of the first light emitting element 22 and a voltage sensor (not shown in the figure), and is configured to drive the first light emitting element 22 to emit light, and control the voltage sensor to sense a voltage at the first terminal of the light emitting element 22.

As shown in FIG. 1, at least one of the plurality of display pixel units 30 may include a second pixel circuit 31 and a second light emitting element 32. In the embodiment of the present disclosure, it may also be the case that each display pixel unit 30 includes a second pixel circuit 31 and a second light emitting element 32. The second pixel circuit 31 is connected to a first terminal of the second light emitting element 32, and is configured to drive the second light emitting element 32 to emit light to display an image.

For example, the first light emitting element 22 included in the sensing pixel unit 20 and the second light emitting element 32 included in the display pixel unit 30 may be the same light emitting element or different light emitting elements, and the first pixel circuit 21 included in the sensing pixel unit 20 and the second pixel circuit 31 included in the display pixel unit 30 may be the same pixel circuit or different pixel circuits, and the embodiments of the present disclosure are not limited thereto.

It should be noted that, for the sake of simplicity, only one sensing pixel unit 20 and one display pixel unit 30 are shown in FIG. 1, but the number of the sensing pixel units 20 and the number of the display pixel units 30 are obviously not limited thereto, and an appropriate number of sensing pixel units 20 and an appropriate number of display pixel units 30 may be provided as needed.

In addition, a plurality of dummy pixel units 130 may be provided in at least part of the dummy region 13, and at least one of the plurality of dummy pixel units 130 may include a third light emitting element 131 and a third pixel circuit 132. In the embodiment of the present disclosure, it may also be the case that each dummy pixel unit 130 may include a third light emitting element 131 and a third pixel circuit 132, so as to ensure the same uniformity as the display region 12. For example, for a first part of the dummy region 13 between the sensing region and the display region 12, a structure of the third light emitting element in the first part of the dummy region 13 is the same as a structure of the second light emitting element 32 in the display region 12, and a structure of the third pixel circuit in the first part of the dummy region 13 is the same as a structure of the second pixel circuit 31 in the display region 12. The dummy region 13 is different from the sensing region and the display region 12 in that: in the first part of the dummy region 13, the third light emitting element is not electrically connected to the third pixel circuit. For example, for a second part of the dummy region 13 between the sensing region 11 and, for example, a left edge of the base substrate 10 and a third part of the dummy region 13 between the display region 12 and, for example, a right edge of the base substrate 10, only an anode pattern of the third light emitting element and a pixel defining layer are provided in the second part and the third part of the dummy region 13. It should be noted that a cathode pattern may also be provided in at least part of the second part and the third part of the dummy region 13.

In addition, a second terminal of the first light emitting element 22 included in the sensing pixel unit 20, a second terminal of the second light emitting element 32 included in the display pixel unit, and a second terminal of the third light emitting element included in the dummy pixel unit are all connected to a common voltage terminal (not shown in the figure). For example, the second terminal of the first light emitting element 22, the second terminal of the second light emitting element 32, and the second terminal of the third light emitting element may form an integrated structure, the integrated structure is connected to the common voltage terminal VCOM and the integrated structure at least covers the sensing region 11, the display region 12, and the at least part of the dummy region 13 between the sensing region 11 and the display region 12.

It should be noted that, in the embodiments of the present disclosure, the silicon substrate may be a single crystal silicon substrate or a silicon-on-insulator (SOI) substrate. The silicon substrate includes the first pixel circuit 21 and the second pixel circuit 31, that is, the first pixel circuit 21 and the second pixel circuit 31 are prepared in the silicon substrate. For example, any suitable circuit components such as a gate driving circuit and a data driving circuit may be integrated on the silicon substrate, and these circuit components (i.e., the first pixel circuit 21, the second pixel circuit 31, the gate driving circuit, and the data driving circuit, etc.) are prepared by, for example, a silicon semiconductor process (e.g., a CMOS process), and the embodiments of the present disclosure do not limit this.

It should be noted that, in the embodiments of the present disclosure, the first light emitting element 22 and the second light emitting element 32 may be the same light emitting element, and except that the first pixel circuit 21 includes a sensing structure that can sense the voltage at the first terminal of the first light emitting element 22, the remaining structures of the first pixel circuit 21 may be substantially the same as or similar to the structure of the second pixel circuit 31, that is, in the case where the same data signal is written to the first pixel circuit 21 and the second pixel circuit 31, the voltage, which is sensed by the voltage sensor under the control of the first pixel circuit 21, at the first terminal of the first light emitting element 22 is actually equivalent to the voltage at the first terminal of the second light emitting element 32.

In addition, the display substrate provided by an embodiment of the present disclosure may further include an adjustment circuit (not shown in the figure), and the adjustment circuit is configured to adjust, based on the temperature of the display substrate, the preset light emitting brightness, and the sensed voltage at the first terminal of the first light emitting element 22, the voltage provided by the common voltage terminal connected to the second terminal of the second light emitting element 32 in the display pixel unit 30, so that the second light emitting element 32 in the display pixel unit 30 can reach the preset light emitting brightness under a certain temperature condition. The preset light emitting brightness is determined by a data signal applied to the second pixel circuit 31, and the preset light emitting brightness indicates a desired brightness that the second light emitting element 32 can achieve. The relationship among the preset light emitting brightness, the temperature of the display substrate, and the data signal can be set in advance. The temperature of the display substrate indicates a temperature inside the device when the display substrate is in a working state, and can be detected via a temperature sensor provided in a driving chip or in the dummy region 13 of the base substrate 10.

In the embodiments of the present disclosure, the voltage sensor and the adjustment circuit may be separately provided, or may be integrated into the same IC (integrated circuit) chip.

In the display substrate provided by the embodiments of the present disclosure, light emitting characteristics of the light emitting element (i.e., the first light emitting element 22 or the second light emitting element 32) are affected by the temperature of the display substrate, and the light emitting element has different light emitting characteristics under different temperature conditions; in particular, in a case where a voltage difference between the voltage at the first terminal of the light emitting element and the voltage at the second terminal of the light emitting element is constant, the light emitting brightness of the light emitting element is different as the temperature of the display substrate changes. In the case where the temperature of the display substrate is constant, the greater the voltage difference between the voltage at the first terminal of the light emitting element and the voltage at the second terminal of the light emitting element, the greater the light emitting brightness of the light emitting element. The light emitting brightness of the light emitting element, the temperature of the display substrate, and the voltage difference between the voltage at the first terminal of the light emitting element and the voltage at the second terminal of the light emitting element are in a corresponding relationship with each other. For example, in a case where the temperature of the display substrate is relatively low, the light emitting brightness of the light emitting element can be improved by increasing the voltage difference between the voltage at the first terminal of the light emitting element and the voltage at the second terminal of the light emitting element; and in a case where the temperature of the display substrate is relatively high, the light emitting brightness of the light emitting element can be reduced by reducing the voltage difference between the voltage at the first terminal of the light emitting element and the voltage at the second terminal of the light emitting element.

In the display substrate provided by the embodiment of the present disclosure, according to the voltage, which is sensed by the voltage sensor under the control of the first pixel circuit 21, at the first terminal of the first light emitting element 22 (i.e., the first terminal of the second light emitting element 32) and the common voltage provided by the common voltage terminal to which the second terminal of the second light emitting element 32 is connected, an actual voltage difference between the voltage at the first terminal of the second light emitting element 32 and the voltage at the second terminal of the second light emitting element 32 at the current moment can be obtained, and according to the current temperature of the display substrate sensed by the temperature sensor and the preset light emitting brightness, a preset voltage difference, corresponding to the preset light emitting brightness at the current temperature of the display substrate, between the voltage at the first terminal of the second light emitting element 32 and the voltage at the second terminal of the second light emitting element 32 can be determined, if the actual voltage difference is different from the preset voltage difference, the magnitude of the common voltage provided by the common voltage terminal can be adjusted to change the actual voltage difference between the voltage at the first terminal of the second light emitting element 32 and the voltage at the second terminal of the second light emitting element 32, so that the actual voltage difference is the same as the preset voltage difference, and thus the light emitting brightness of the second light emitting element 32 corresponds to the current temperature of the display substrate.

In the display substrate provided by the embodiment of the present disclosure, the first pixel circuit 21 controls the voltage sensor to sense the voltage at the first terminal of the first light emitting element 22, and because except that the first pixel circuit 21 includes a sensing structure that can sense the voltage at the first terminal of the first light emitting element 22, the remaining structures of the first pixel circuit 21 may be substantially the same as or similar to the structure of the second pixel circuit 31, in the case where the same data signal is written to the first pixel circuit 21 and the second pixel circuit 31, the voltage at the first terminal of the first light emitting element 22 sensed by the voltage sensor is equivalent to the voltage at the first terminal of the second light emitting element 32, so that the voltage at the first terminal of the second light emitting element 32 can be directly sensed without additionally providing a sensing structure in the second pixel circuit 31, thereby preventing the additional sensing structure from affecting the display performance of the display pixel unit 30.

Figure 2:
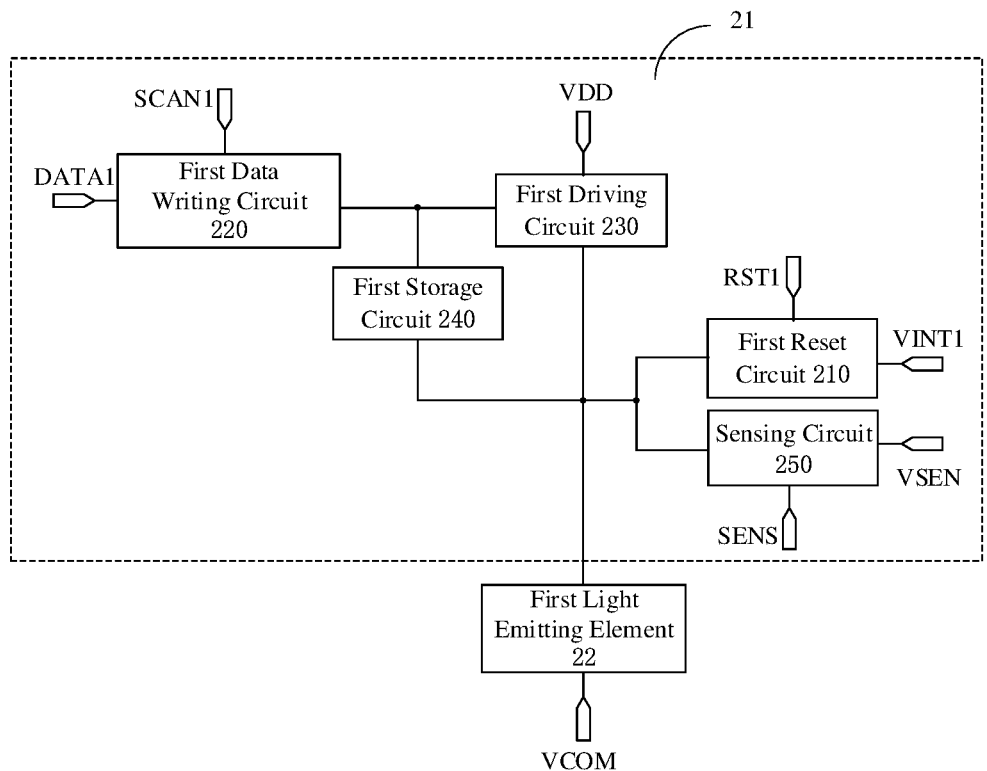
FIG. 2 is a schematic block diagram of a sensing pixel unit in FIG. 1.

FIG. 2 is a schematic block diagram of the sensing pixel unit 20 in FIG. 1. As shown in FIG. 2, in the sensing pixel unit 20, the first pixel circuit 21 includes a first reset circuit 210, a first data writing circuit 220, a first driving circuit 230, a first storage circuit 240, and a sensing circuit 250.

As shown in FIG. 2, the first reset circuit 210 is connected to a first reset control signal line RST1, a first reset voltage terminal VINT1, a second terminal of the first driving circuit 230, and the first terminal of the first light emitting element 22, and is configured to apply a first reset voltage to the second terminal of the first driving circuit 230 and the first terminal of the first light emitting element 22 under control of a first reset control signal, so as to reset the second terminal of the first driving circuit 230, i.e., reset the first terminal of the first light emitting element 22.

As shown in FIG. 2, the first data writing circuit 220 is connected to a first scanning signal line SCAN1, a first data signal line DATA1, and a control terminal of the first driving circuit 230, and is configured to write a first data signal to the control terminal of the first driving circuit 230 under control of a first scan signal.

As shown in FIG. 2, a first terminal of the first driving circuit 230 is connected to a first voltage terminal VDD, the second terminal of the first driving circuit 230 is connected to the first terminal of the first light emitting element 22, and the first driving circuit 230 is configured to drive the first light emitting element 22 to emit light under control of the voltage applied to the control terminal of the first driving circuit 230.

As shown in FIG. 2, the first storage circuit 240 is connected to the control terminal and the second terminal of the first driving circuit 230, and is configured to store the first data signal and hold the first data signal at the control terminal of the first driving circuit 230.

As shown in FIG. 2, the sensing circuit 250 is connected to a voltage sensor VSEN, a sensing control signal line SENS, the second terminal of the first driving circuit 230, and the first terminal of the first light emitting element 22, and is configured to sense the voltage at the second terminal of the first driving circuit 230, i.e., sense the voltage at the first terminal of the first light emitting element 22, using the voltage sensor VSEN under control of a sensing control signal.

As shown in FIG. 2, the first terminal of the first light emitting element 22 is connected to the second terminal of the first driving circuit 230, and the second terminal of the first light emitting element 22 is connected to a common voltage terminal VCOM.

Figure 3:
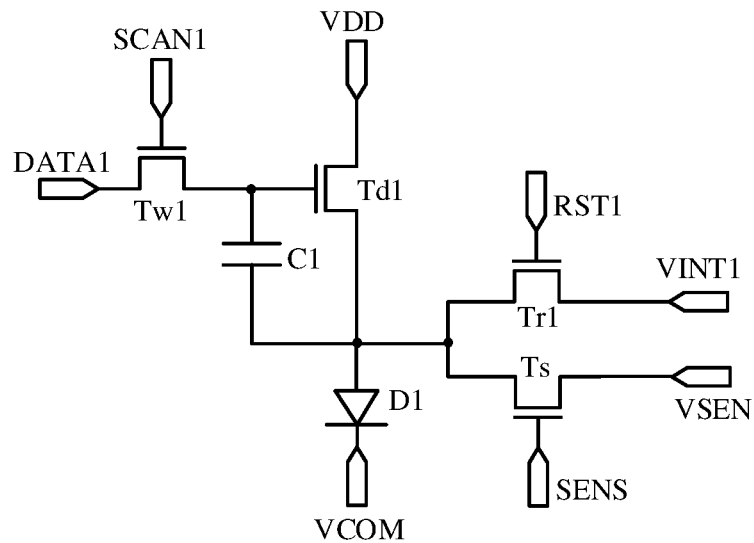
FIG. 3 is a circuit structure diagram of a sensing pixel unit in FIG. 2.

FIG. 3 is a circuit structure diagram of the sensing pixel unit 20 in FIG. 2. As shown in FIG. 3, in the first pixel circuit 21 of the sensing pixel unit 20, the first reset circuit 210 includes a first reset transistor Tr1, the first data writing circuit 220 includes a first data writing transistor Tw1, the first driving circuit 230 includes a first driving transistor Td1, the first storage circuit 240 includes a first storage capacitor C1, and the sensing circuit 250 includes a sensing transistor Ts. As shown in FIG. 3, in the sensing pixel unit 20, the first light emitting element 22 includes a first OLED D1.

For example, the control terminal of the first driving circuit 230 includes a gate electrode of the first driving transistor Td1, the first terminal of the first driving circuit 230 includes a first electrode of the first driving transistor Td1, and the second terminal of the first driving circuit 230 includes a second electrode of the first driving transistor Td1; the first terminal of the first light emitting element 22 includes an anode of the first OLED D1, and the second terminal of the first light emitting element 22 includes a cathode of the first OLED D1.

As shown in FIG. 3, a gate electrode of the first reset transistor Tr1 is connected to the first reset control signal line RST1 to receive the first reset control signal, a first electrode of the first reset transistor Tr1 is connected to the first reset voltage terminal VINT1 to receive the reset voltage, and a second electrode of the first reset transistor Tr1 is connected to the second electrode of the first driving transistor Td1 and the anode of the first OLED D1.

As shown in FIG. 3, a gate electrode of the first data writing transistor Tw1 is connected to the first scan signal line SCAN1 to receive the first scan signal, a first electrode of the first data writing transistor Tw1 is connected to the first data signal line DATA1 to receive the first data signal, and a second electrode of the first data writing transistor Tw1 is connected to the gate electrode of the first driving transistor Td1.

As shown in FIG. 3, the gate electrode of the first driving transistor Td1 is connected to the second electrode of the first data writing transistor Tw1, the first electrode of the first driving transistor Td1 is connected to the first voltage terminal VDD, and the second electrode of the first driving transistor Td1 is connected to the anode of the first OLED D1.

As shown in FIG. 3, a first terminal of the first storage capacitor C1 is connected to the second electrode of the first data writing transistor Tw1 and the gate electrode of the first driving transistor Td1, and a second terminal of the first storage capacitor C1 is connected to the second electrode of the first driving transistor Td1.

As shown in FIG. 3, a gate electrode of the sensing transistor Ts is connected to the sensing control signal line SENS to receive the sensing control signal, a first electrode of the sensing transistor Ts is connected to the voltage sensor VSEN, and a second electrode of the sensing transistor Ts is connected to the second electrode of the first driving transistor Td1 and the anode of the first OLED D1.

As shown in FIG. 3, the anode of the first OLED D1 is connected to the second electrode of the first driving transistor Td1, and the cathode of the first OLED D1 is connected to the common voltage terminal VCOM.

It should be noted that the transistors adopted in the embodiments of the present disclosure may all be thin-film transistors (TFTs) or field-effect transistors (FETs) or other switching elements with the same characteristics, and the embodiments of the present disclosure are described by taking thin film transistors as an example. The source electrode and the drain electrode of a transistor adopted here may be symmetrical in structure, so the source electrode and the drain electrode of the transistor may have no difference in structure. In the embodiments of the present disclosure, in order to distinguish two electrodes of the transistor except the gate electrode, one electrode of the two electrodes is directly described as the first electrode and the other electrode of the two electrodes is directly described as the second electrode.

In addition, it should be noted that the transistors adopted in the embodiments of the present disclosure may all be P-type transistors or N-type transistors, as long as respective electrodes of a selected type transistor are correspondingly connected in accordance with respective electrodes of a corresponding transistor in the embodiment of the present disclosure, and the corresponding voltage terminals provide corresponding high or low voltages. For example, for N-type transistors, an (current) input terminal of an N-type transistor is a drain electrode and an output terminal of the N-type transistor is a source electrode, and a control terminal of the N-type transistor is a gate electrode; and for P-type transistors, an (current) input terminal of a P-type transistor is a source electrode, an output terminal of the P-type transistor is a drain electrode, and a control terminal of the P-type transistor is a gate electrode. For different types of transistors, levels of control signals at the control terminals of different types of transistors are also different. For example, for an N-type transistor, in a case where the control signal is at a high level, the N-type transistor is in an on state; and in a case where the control signal is at a low level, the N-type transistor is in an off state. For a P-type transistor, in a case where the control signal is at a low level, the P-type transistor is in an on state; and in a case where the control signal is at a high level, the P-type transistor is in an off state. In a case where an N-type transistor is adopted, an oxide semiconductor such as Indium Gallium Zinc Oxide (IGZO) can be used as the active layer of the thin film transistor, which may effectively reduce the size of the transistor and prevent leakage current compared with using Low Temperature Poly Silicon (LTPS) or amorphous silicon (such as hydrogenated amorphous silicon) as the active layer of the thin film transistor. Low-temperature polysilicon generally refers to the case where the crystallization temperature of polysilicon crystallized from amorphous silicon is lower than 600 degrees Celsius.

Figure 4:
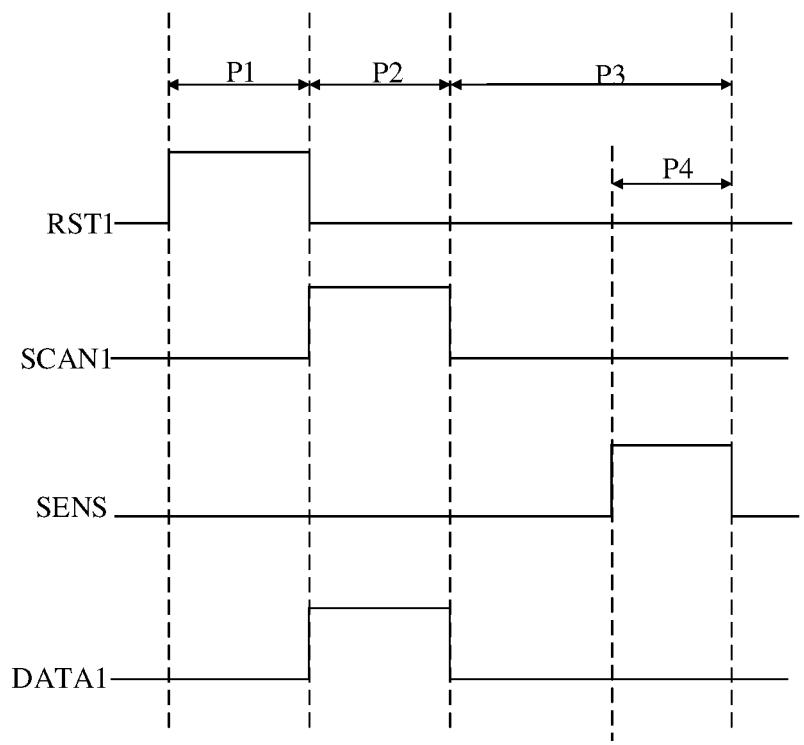
FIG. 4 is a timing diagram of signals input to a first pixel circuit in FIG. 3.

FIG. 4 is a timing chart of signals input to the first pixel circuit shown in FIG. 3. As shown in FIG. 4, the working process of the first pixel circuit 21 includes four stages, i.e., a reset stage P1, a data writing stage P2, a light emitting stage P3, and a sensing stage P4. FIG. 4 shows the timing waveform of the signals in each stage.

Figure 5A:
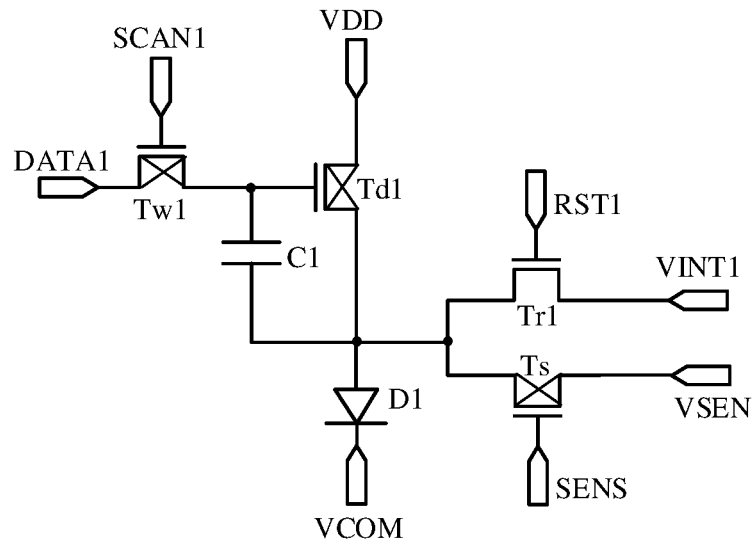
FIG. 5A is an equivalent circuit diagram of a first pixel circuit in FIG. 3 during a reset stage.
Figure 5B:
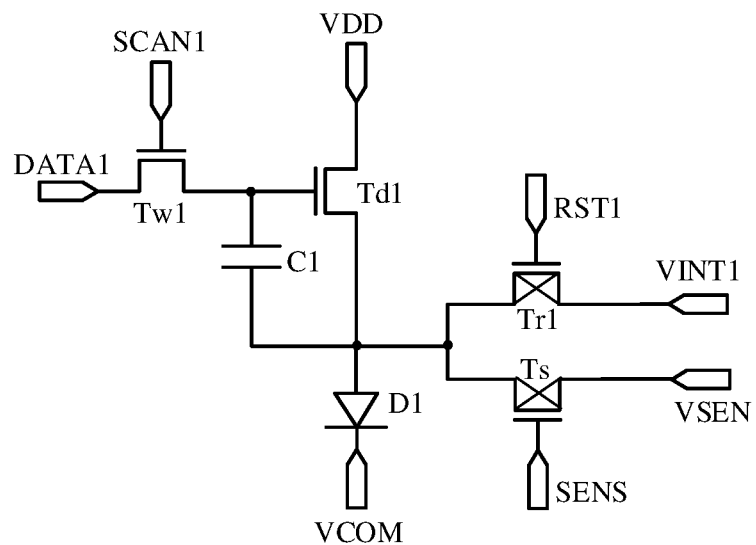
FIG. 5B is an equivalent circuit diagram of a first pixel circuit in FIG. 3 during a data writing stage.
Figure 5C:
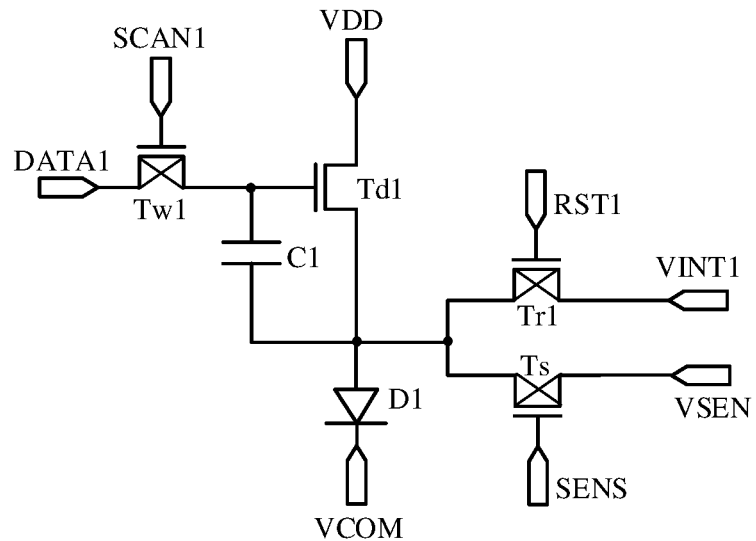
FIG. 5C is an equivalent circuit diagram of a first pixel circuit in FIG. 3 during a light emitting stage.
Figure 5D:
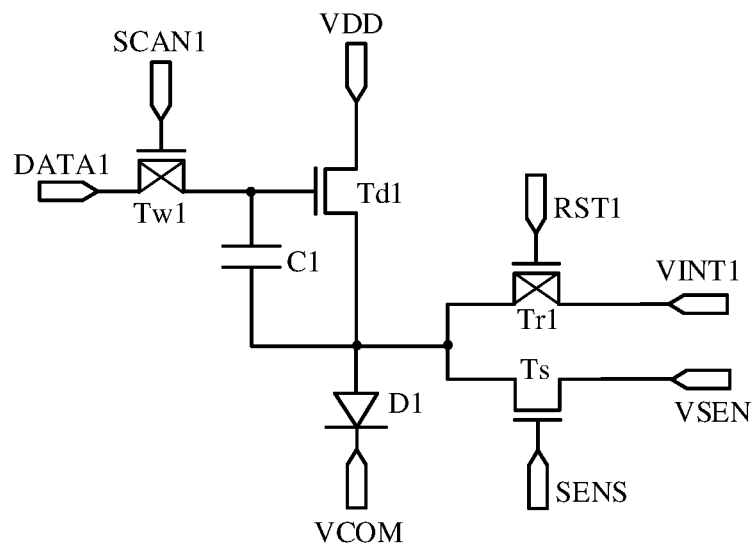
FIG. 5D is an equivalent circuit diagram of a first pixel circuit in FIG. 3 during a sensing stage.

FIG. 5A is an equivalent circuit diagram of the first pixel circuit shown in FIG. 3 in the reset stage; FIG. 5B is an equivalent circuit diagram of the first pixel circuit shown in FIG. 3 in the data writing stage; FIG. 5C is an equivalent circuit diagram of the first pixel circuit shown in FIG. 3 in the light emitting stage; and FIG. 5D is an equivalent circuit diagram of the first pixel circuit shown in FIG. 3 in the sensing stage.

In FIG. 4 and FIGS. 5A, 5B, 5C, and 5D, RST1, SCAN1, SENS, and DATA1 are used to represent both the corresponding signal lines and the corresponding signals. In FIGS. 5A, 5B, 5C, and 5D, VINT1, VDD, and VCOM are used to represent both the corresponding voltage terminals and the corresponding voltages. In addition, in FIGS. 5A, 5B, 5C, and 5D, the transistors marked with "x" indicate that the transistors are in an off state in the corresponding stage.

Taking the case where the first reset transistor Tr1, the first data writing transistor Tw1, the first driving transistor Td1, and the sensing transistor Ts all adopt N-type transistors as an example, the working principle of the first pixel circuit 21 shown in FIG. 3 will be described below with reference to FIGS. 4, 5A, 5B, 5C, and 5D.

As shown in FIG. 4, in the reset stage P1, the first reset control signal RST1 at a high level is input to the gate electrode of the first reset transistor Tr1 (i.e., the first reset circuit 210), and the sensing control signal SENS at a low level is input to the gate electrode of the sensing transistor Ts (i.e., the sensing circuit 250), and the first scan signal SCAN1 at a low level is input to the gate electrode of the first data writing transistor Tw1 (i.e., the first data writing circuit 220).

As shown in FIGS. 4 and 5A, in the reset stage P1, the first reset transistor Tr1 is turned on by the high level of the first reset control signal RST1, the sensing transistor Ts is turned off by the low level of the sensing control signal SENS, and the data writing transistor Tw1 is turned off by the low level of the first scan signal SCAN1. At this time, the first driving transistor Td1 is also in an off state.

As shown in FIG. 5A, in the reset stage P1, because the first reset transistor Tr1 is turned on, the first reset voltage VINT1 can be applied to the second electrode of the first driving transistor Td1 (i.e., the second terminal of the first driving circuit 230) and the anode of the first OLED D1 (i.e., the first terminal of the first light emitting element 22) through the first reset transistor Tr1 to reset the second electrode of the first driving transistor Td1 and the anode of the first OLED D1.

As shown in FIG. 4, in the data writing stage P2, the first scan signal SCAN1 at a high level is input to the gate electrode of the first data writing transistor Tw1, the first reset control signal RST1 at a low level is input to the gate electrode of the first reset transistor Tr1, and the sensing control signal SENS at a low level is input to the gate electrode of the sensing transistor Ts.

As shown in FIGS. 4 and 5B, in the data writing stage P2, the first data writing transistor Tw1 is turned on by the high level of the first scan signal SCAN1, the first reset transistor Tr1 is turned off by the low level of the first reset control signal RST1, and the sensing transistor Ts is turned off by the low level of the sensing control signal SENS.

As shown in FIG. 5B, in the data writing stage P2, because the first data writing transistor Tw1 is turned on, the first data signal DATA1 is written into the gate electrode of the first driving transistor Td1 through the first data writing transistor Tw1, and at the same time, the first storage capacitor C1 (i.e., the first storage circuit 240) is charged by the first data signal DATA1 through the first data writing transistor Tw1 until the voltage at the first terminal of the first storage capacitor C1 is Vdata1, so that the first data signal DATA1 is stored in the first storage capacitor C1, and the first storage capacitor C1 holds the stored first data signal DATA1 at the gate electrode of the first driving transistor Td1. Here, Vdata1 represents the voltage of the first data signal DATA1.

As shown in FIG. 4, in the light emitting stage P3, the first scan signal SCAN1 at a low level is input to the gate electrode of the first data writing transistor Tw1, the first reset control signal RST1 at a low level is input to the gate electrode of the first reset transistor Tr1, and the sensing control signal SENS at a low level is input to the gate electrode of the sensing transistor Ts.

As shown in FIGS. 4 and 5C, in the light emitting stage P3, the first data writing transistor Tw1 is turned off by the low level of the first scan signal SCAN1, the first reset transistor Tr1 is turned off by the low level of the first reset control signal RST1, and the sensing transistor Ts is turned off by the low level of the sensing control signal SENS.

As shown in FIG. 5C, in the light emitting stage P3, because the first storage capacitor C1 holds the stored first data signal DATA1 at the gate electrode of the first driving transistor Td1, the voltage of the gate electrode of the first driving transistor Td1 is Vdata1, the first driving transistor Td1 is turned on, and the first voltage VDD drives the first light emitting element 22 to emit light through the first driving transistor Td1.

As shown in FIG. 4, in the sensing stage P4, the sensing control signal SENS at a high level is input to the gate electrode of the sensing transistor Ts (i.e., the sensing circuit 250) to turn on the sensing transistor Ts, the first scan signal SCAN1 at a low level is input to the gate electrode of the first data wiring transistor Tw1, and the first reset control signal RST1 at a low level is input to the gate electrode of the first reset transistor Tr1.

As shown in FIGS. 4 and 5D, in the sensing stage P4, the sensing transistor Ts is turned on by the high level of the sensing control signal SENS, the first data writing transistor Tw1 is turned off by the low level of the first scan signal SCAN1, and the first reset transistor Tr1 is turned off by the low level of the first reset control signal RST1.

As shown in FIG. 5D, in the sensing stage P4, because the sensing transistor Ts is turned on, the voltage sensor VSEN senses the voltage of the second electrode of the first driving transistor Td1 or the anode of the first OLED D1 through the sensing transistor Ts.

As shown in FIG. 4, the sensing stage P4 may be a part of the light emitting stage P3, that is, in the light emitting stage P3, when the sensing transistor Ts is turned on by the high level of the sensing control signal SENS, the first pixel circuit 21 also enters the sensing stage P4 at the same time. In this way, in the sensing stage P4, the voltage sensor VSEN can sense the voltage of the anode of the first OLED D1 in the light emitting state in real time through the sensing transistor Ts.

It should be noted that in the embodiment of the present disclosure, the first driving transistor Td1 works in a sub-threshold region, and in this case, a driving current generated by the first driving transistor Td1 can be obtained according to the following formula:

$$I_L = I_o \exp\left(\frac{q(Vgs - Vth)}{nkT}\right) = I_{o1} \exp\left(\frac{q(Vdata1 - Vs - Vth)}{nkT}\right)$$

In the above formula, $I_L$ represents the driving current, Vth represents the threshold voltage of the first driving transistor Td1, Vgs represents a voltage difference between the gate electrode and the second electrode (e.g., the source electrode) of the first driving transistor Td1, $I_{o1}$ represents the driving current in a case of Vgs=Vth, Vs represents the voltage of the second electrode of the first driving transistor Td1, q is the amount of electrons (a constant value), n is the channel doping concentration of the first driving transistor Td1, and k is a constant value, and T is an operating temperature of the first driving transistor Td1 (i.e., the temperature of the display substrate).

In addition, the current flowing through the first OLED D1 can be obtained according to the following formula:

$$I_{oled} = I_{o2}\exp\left(\frac{qVoled}{kT}\right) = I_{o2}\exp\left(\frac{q(Vs - Vcom)}{kT}\right)$$

In the above formula, $I_{oled}$ represents the current flowing through the first OLED D1, $V_{oled}$ represents the voltage difference between the anode and the cathode of the first OLED D1, and $I_{o2}$ represents the current flowing through the first OLED D1 at the moment when the first OLED D1 is turned on, Vcom represents the voltage provided by the common voltage terminal VCOM, and T is an operating temperature of the first OLED D1 (i.e., the temperature of the display substrate).

In the embodiment of the present disclosure, in a case where the first driving transistor Td1 operates in the sub-threshold region, in an ideal case, there is a linear relationship between the voltage Vs of the second electrode of the first driving transistor Td1 and the voltage Vdata1 of the gate electrode of the first driving transistor Td1, $V_s = a \cdot Vdata1 + b$, where a and b are constants. In other words, the voltage of the second electrode of the first driving transistor Td1 changes linearly with the change of the voltage of the gate electrode of the first driving transistor Td1. Therefore, the voltages written to the gate electrode of the first driving transistor Td1 (i.e., the voltage of the first data signal DATA1) are different, and the voltages Vs of the second electrode of the first driving transistor Td1 are also different. In the sensing stage P4, the voltage Vs of the second electrode of the first driving transistor Td1 is sensed by the voltage sensor VSEN, that is, the voltage of the anode of the first OLED D1 is sensed, and on this basis, by adjusting the common voltage provided by the common voltage terminal VCOM, the voltage difference between the two electrodes of the first OLED D1 can be adjusted, thereby adjusting the light emitting brightness of the first OLED D1.

Figure 6:
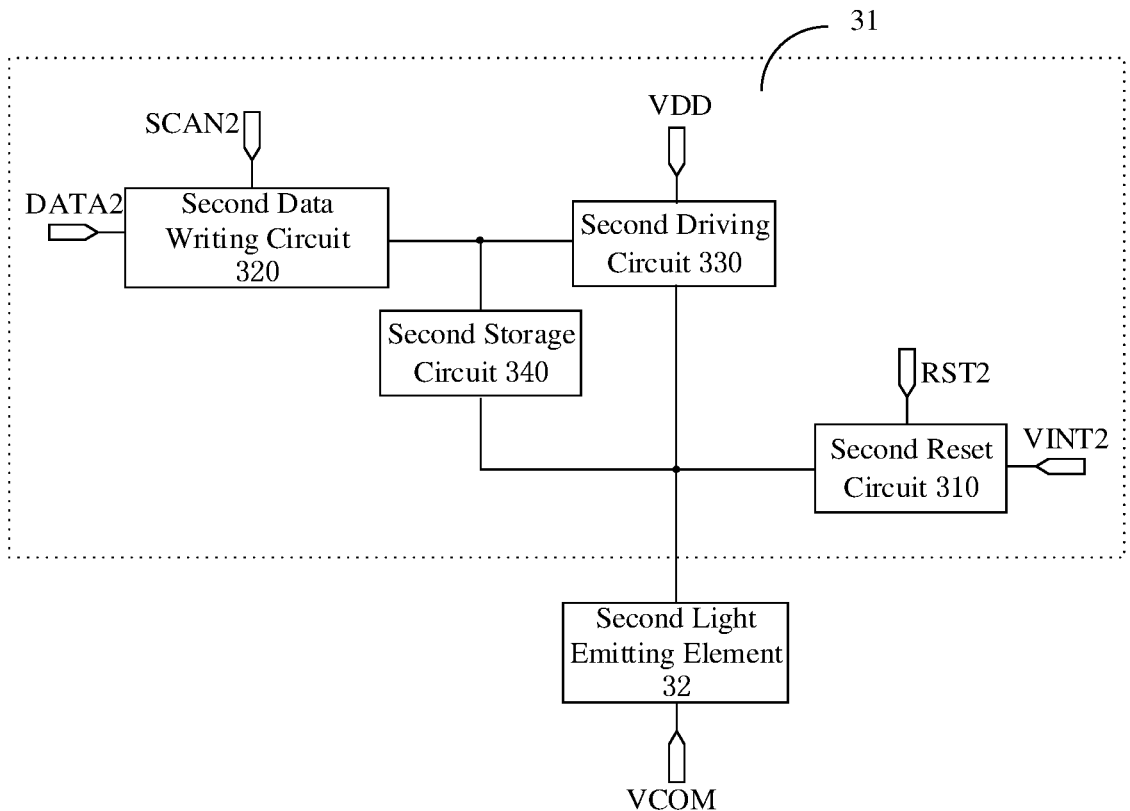
FIG. 6 is a schematic block diagram of a display pixel unit in FIG. 1.

FIG. 6 is a schematic block diagram of the display pixel unit 30 in FIG. 1. As shown in FIG. 6, in the display pixel unit 30, the second pixel circuit 31 includes a second reset circuit 310, a second data writing circuit 320, a second driving circuit 330, and a second storage circuit 340. Except that the display pixel unit 30 shown in FIG. 6 does not include the sensing circuit, the remaining components of the display pixel unit 30 shown in FIG. 6 are substantially the same as or similar to the sensing pixel unit 20 shown in FIG. 2.

As shown in FIG. 6, the second reset circuit 310 is connected to a second reset control signal line RST2, a second reset voltage terminal VINT2, a second terminal of the second driving circuit 330, and a first terminal of the second light emitting element 32, and is configured to apply a second reset voltage to the second terminal of the second driving circuit 330 and the first terminal of the second light emitting element 32 under the control of a second reset control signal, so as to reset the second terminal of the second driving circuit 330, i.e., reset the first terminal of the second light emitting element 32.

As shown in FIG. 6, the second data writing circuit 320 is connected to a second scan signal line SCAN2, a second data signal line DATA2, and a control terminal of the second driving circuit 330, and is configured to write a second data signal to the control terminal of the second driving circuit 330 under the control of a second scan signal.

As shown in FIG. 6, a first terminal of the second driving circuit 330 is connected to the first voltage terminal VDD, the second terminal of the second driving circuit 330 is connected to the first terminal of the second light emitting element 32, and the second driving circuit 330 is configured to drive the second light emitting element 32 to emit light under the control of the voltage applied to the control terminal of the second driving circuit 330.

As shown in FIG. 6, the second storage circuit 340 is connected to the control terminal and the second terminal of the second driving circuit 330, and is configured to store the second data signal and hold the second data signal at the control terminal of the second driving circuit 330.

As shown in FIG. 6, the first terminal of the second light emitting element 32 is connected to the second terminal of the second driving circuit 330, and the second terminal of the second light emitting element 32 is connected to the common voltage terminal VCOM.

Figure 7:
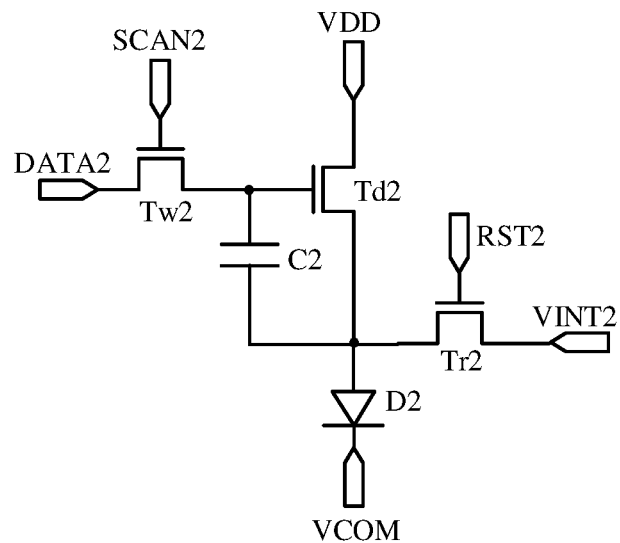
FIG. 7 is a circuit structure diagram of a display pixel unit shown in FIG. 6.

FIG. 7 is a circuit structure diagram of the display pixel unit 30 shown in FIG. 6. As shown in FIG. 7, in the display pixel unit 30, the second reset circuit 310 includes a second reset transistor Tr2, the second data writing circuit 320 includes a second data writing transistor Tw2, the second driving circuit 330 includes a second driving transistor Td2, and the second storage circuit 340 include a second storage capacitor C2. As shown in FIG. 7, in the display pixel unit 30, the second light emitting element 32 includes a second OLED D2. Except that the display pixel unit 30 shown in FIG. 7 does not include the sensing transistor, the remaining circuit structures of the circuit of the display pixel unit 30 shown in FIG. 7 are substantially the same as or similar to the sensing pixel unit 20 shown in FIG. 3.

For example, the control terminal of the second driving circuit 330 includes a gate electrode of the second driving transistor Td2, the first terminal of the second driving circuit 330 includes a first electrode of the second driving transistor Td2, and the second terminal of the second driving circuit 330 includes a second electrode of the second driving transistor Td2; the first terminal of the second light emitting element 32 includes an anode of the second OLED D2, and the second terminal of the second light emitting element 32 includes a cathode of the second OLED D2.

As shown in FIG. 7, a gate electrode of the second reset transistor Tr2 is connected to the second reset control signal line RST2 to receive the second reset control signal, a first electrode of the second reset transistor Tr2 is connected to the second reset voltage terminal VINT2 to receive the second reset voltage, and a second electrode of the second reset transistor Tr2 is connected to the second electrode of the second driving transistor Td2 and the anode of the second OLED D2.

As shown in FIG. 7, a gate electrode of the second data writing transistor Tw2 is connected to the second scan signal line SCAN2 to receive the second scan signal, a first electrode of the second data writing transistor Tw2 is connected to the second data signal line DATA2 to receive the second data signal, and a second electrode of the second data writing transistor Tw2 is connected to the gate electrode of the second driving transistor Td2.

As shown in FIG. 7, the gate electrode of the second driving transistor Td2 is connected to the second electrode of the second data writing transistor Tw2, the first electrode of the second driving transistor Td2 is connected to the first voltage terminal VDD, and the second electrode of the second driving transistor Td2 is connected to the anode of the second OLED D2.

As shown in FIG. 7, a first terminal of the second storage capacitor C2 is connected to the second electrode of the second data writing transistor Tw2 and the gate electrode of the second driving transistor Td2, and a second terminal of the second storage capacitor C2 is connected to the second electrode of the second driving transistor Td2.

As shown in FIG. 7, the anode of the second OLED D2 is connected to the second electrode of the second driving transistor Td2, and the cathode of the second OLED D2 is connected to the common voltage terminal VCOM.

The working process of the second pixel circuit 31 in FIG. 7 includes a reset stage, a data writing stage, and a light emitting stage. Except that the working process of the second pixel circuit 31 in FIG. 7 does not include the sensing stage, the remaining stages of the working process of the second pixel circuit 31 in FIG. 7 are basically the same as or similar to the working process of the first pixel circuit 21 shown in FIG. 3, and therefore, reference may be made to the working process of the first pixel circuit 21 described in conjunction with FIG. 4 and FIGS. 5A, 5B, and 5C, and details are not described here.

Figure 8:
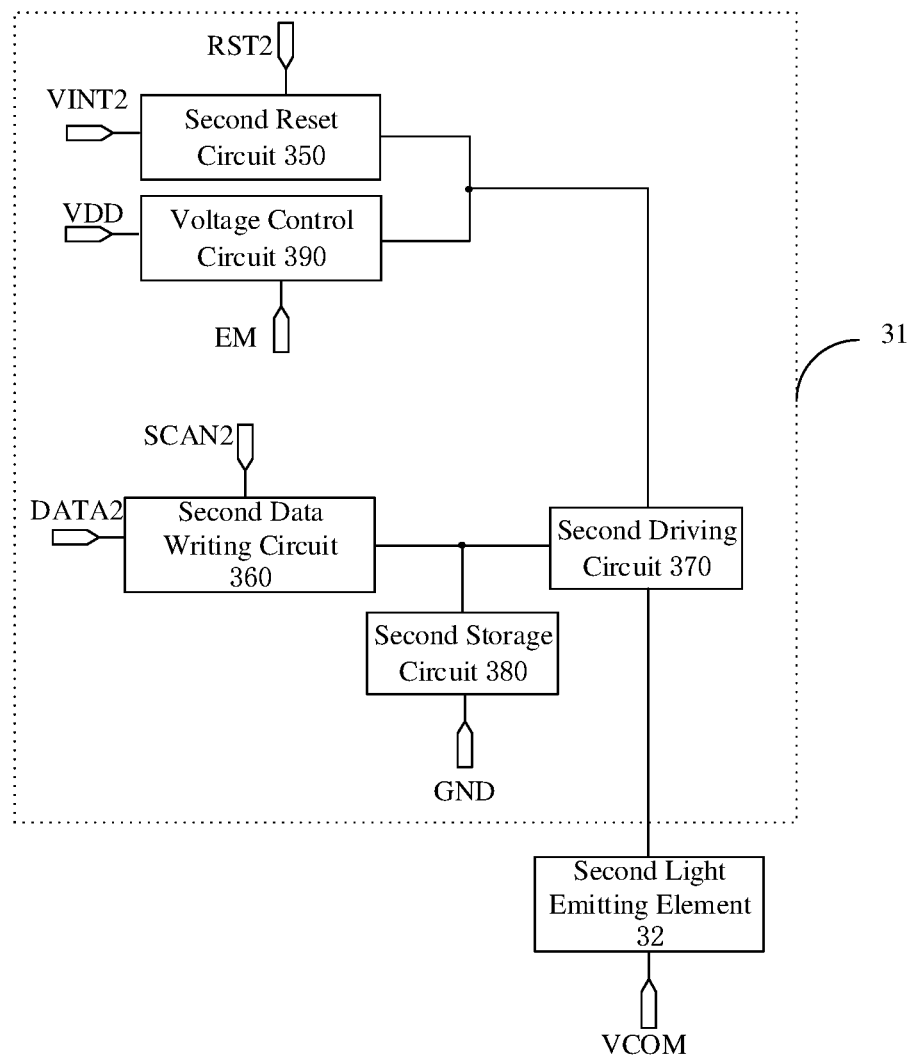
FIG. 8 is another schematic block diagram of a display pixel unit in FIG. 1.

FIG. 8 is another schematic block diagram of the display pixel unit 30 in FIG. 1. As shown in FIG. 8, in the display pixel unit 30, the second pixel circuit 31 includes a second reset circuit 350, a second data writing circuit 360, a second driving circuit 370, a second storage circuit 380, and a voltage control circuit 390. Except that the display pixel unit 30 shown in FIG. 8 does not include a sensing circuit and a voltage control circuit, the remaining circuits of the display pixel unit 30 shown in FIG. 8 are basically the same as or similar to those of the sensing pixel unit 20 shown in FIG. 2.

As shown in FIG. 8, the second reset circuit 350 is connected to the second reset control signal line RST2, the second reset voltage terminal VINT2, and a first terminal of the second driving circuit 370, and is configured to apply the second reset voltage to the first terminal of the second driving circuit 370 under the control of the second reset control signal, so as to reset the first terminal of the second light emitting element 32 through the second driving circuit 370.

As shown in FIG. 8, the second data writing circuit 360 is connected to the second scan signal line SCAN2, the second data signal line DATA2, and a control terminal of the second driving circuit 370, and is configured to write the second data signal to the control terminal of the second driving circuit 370 under the control of the second scan signal.

As shown in FIG. 8, a second terminal of the second driving circuit 370 is connected to the first terminal of the second light emitting element 32, and the second driving circuit 370 is configured to drive the second light emitting element 32 to emit light under the control of the voltage applied to the control terminal of the second driving circuit 370.

As shown in FIG. 8, the second storage circuit 380 is connected to the control terminal of the second driving circuit 370 and a ground terminal GND, and is configured to store the second data signal and hold the second data signal at the control terminal of the second driving circuit 330.

As shown in FIG. 8, the voltage control circuit 390 is connected to the first voltage terminal VDD, a voltage control signal terminal EM, and the first terminal of the second driving circuit 370, and is configured to apply a first voltage to the first terminal of the second driving circuit 370 under the control of a voltage control signal.

As shown in FIG. 8, the first terminal of the second light emitting element 32 is connected to the second terminal of the second driving circuit 370, and the second terminal of the second light emitting element 32 is connected to the common voltage terminal VCOM.

Figure 9:
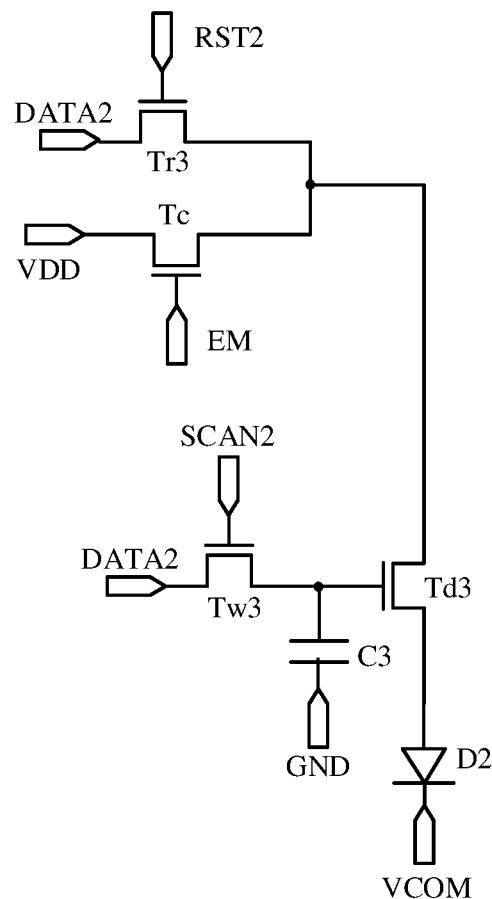
FIG. 9 is a circuit structure diagram of a display pixel unit shown in FIG. 8.

FIG. 9 is a circuit structure diagram of the display pixel unit 30 shown in FIG. 8. As shown in FIG. 9, in the display pixel unit 30, the second reset circuit 350 includes a second reset transistor Tr3, the second data writing circuit 360 includes a second data writing transistor Tw3, the second driving circuit 370 includes a second driving transistor Td3, the second storage circuit 380 includes a second storage capacitor C3, and the voltage control circuit 390 includes a voltage control transistor Tc. As shown in FIG. 9, in the display pixel unit 30, the second light emitting element 32 includes a second OLED D2. Except that the display pixel unit 30 shown in FIG. 9 does not include a sensing transistor and a voltage control transistor, the remaining circuit structures of the circuit of the display pixel unit 30 shown in FIG. 9 are basically the same as or similar to those of the sensing pixel unit 20 shown in FIG. 3.

As shown in FIG. 9, the control terminal of the second driving circuit 370 includes a gate electrode of the second driving transistor Td3, the first terminal of the second driving circuit 370 includes a first electrode of the second driving transistor Td3, and the second terminal of the second driving circuit 370 includes a second electrode of the second driving transistor Td3; the first terminal of the second light emitting element 32 includes an anode of the second OLED D2, and the second terminal of the second light emitting element 32 includes a cathode of the second OLED D2.

As shown in FIG. 9, a gate electrode of the second reset transistor Tr3 is connected to the second reset control signal line RST2 to receive the second reset control signal, a first electrode of the second reset transistor Tr3 is connected to the second reset voltage terminal VINT2 to receive the second reset voltage, and a second electrode of the second reset transistor Tr3 is connected to the first electrode of the second driving transistor Td3.

As shown in FIG. 9, a gate electrode of the second data writing transistor Tw3 is connected to the second scan signal line SCAN2 to receive the second scan signal, a first electrode of the second data writing transistor Tw3 is connected to the second data signal line DATA2 to receive the second data signal, and a second electrode of the second data writing transistor Tw3 is connected to the gate electrode of the second driving transistor Td3.

As shown in FIG. 9, the gate electrode of the second driving transistor Td3 is connected to the second electrode of the second data writing transistor Tw3, the first electrode of the second driving transistor Td3 is connected to the second electrode of the second reset transistor Tr3 and a second electrode of the voltage control transistor Tc, and the second electrode of the second driving transistor Td3 is connected to the anode of the second OLED D2.

As shown in FIG. 9, a first terminal of the second storage capacitor C3 is connected to the second electrode of the second data writing transistor Tw3 and the gate electrode of the second driving transistor Td3, and a second terminal of the second storage capacitor C3 is connected to the ground terminal GND.

As shown in FIG. 9, a gate electrode of the voltage control transistor Tc is connected to the voltage control signal terminal EM, a first electrode of the voltage control transistor Tc is connected to the first voltage terminal VDD, and the second electrode of the voltage control transistor Tc is connected to the first electrode of the second driving transistor Td2.

As shown in FIG. 9, the anode of the second OLED D2 is connected to the second electrode of the second driving transistor Td2, and the cathode of the second OLED D2 is connected to the common voltage terminal VCOM.

The working process of the second pixel circuit 31 in FIG. 9 includes a reset stage, a data writing stage, and a light emitting stage. Taking the case where the second reset transistor Tr3, the second data writing transistor Tw3, the second driving transistor Td3, and the voltage control transistor Tc all adopt N-type transistors as an example, the working principle of the second pixel circuit 31 shown in FIG. 9 will be briefly described.

In the reset stage, the second reset transistor Tr3 is turned on by the high level of the second reset control signal, and the second reset voltage is applied to the first electrode of the second driving transistor Td3 through the second reset transistor Tr3 to reset the anode of the second OLED D2.

In the data writing stage, the second data writing transistor Tw3 is turned on by the high level of the second scan signal, and the second data signal charges the second storage capacitor C2 through the second data writing transistor Tw3, so that the second data signal is stored in the second storage capacitor C3, and the second storage capacitor C3 holds the stored second data signal at the gate electrode of the second driving transistor Td3.

In the light emitting stage, because the second storage capacitor C3 holds the stored second data signal at the gate electrode of the second driving transistor Td3, the second driving transistor Td3 remains turned on; in this case, the voltage control transistor Tc is turned on by the high level of the voltage control signal, and the first voltage is applied to the first electrode of the second driving transistor Td3 through the voltage control transistor Tc to drive the second OLED D2 to emit light.

Referring to and comparing FIGS. 7 and 9, for the second pixel circuit 31 shown in FIG. 7, during the reset stage, the second reset voltage is directly applied to the anode of the second OLED D2 through the second reset transistor Tr2 to reset the anode of the second OLED D2; for the second pixel circuit 31 shown in FIG. 9, in the reset stage, the second reset voltage is applied to the anode of the second OLED D2 through the second reset transistor Tr3 and the second driving transistor Td3 to reset the anode of the second OLED D2. In addition, referring to and comparing FIGS. 7 and 9, for the second pixel circuit 31 shown in FIG. 7, during the light emitting stage, the first voltage is directly applied to the first electrode of the second driving transistor Td2 to drive the second OLED D2 to emit light; for the second pixel circuit 31 shown in FIG. 9, during the light emitting stage, the first voltage is applied to the first electrode of the second driving transistor Td3 through the voltage control transistor Tc to drive the second OLED D2 to emit light.

Figure 10:
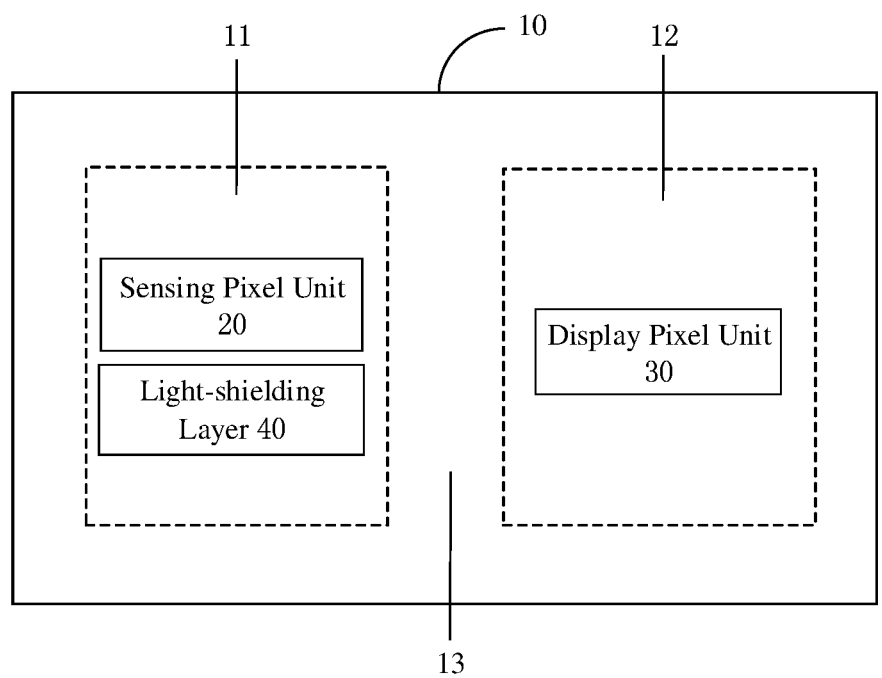
FIG. 10 is a schematic block diagram of another display substrate provided by an embodiment of the present disclosure.

It should be noted that, in the display substrate provided by the embodiments of the present disclosure, the plurality of second pixel circuits 31 included in the plurality of display pixel units 30 may all adopt the structure of the second pixel circuit 31 shown in FIGS. 6 and 7, or may all adopt the structure of the second pixel circuit 31 shown in FIGS. 9 and 10, or may also partially adopt the structure of the second pixel circuit 31 shown in FIGS. 6 and 7 and partially adopt the structure of the second pixel circuit 31 shown in FIGS. 9 and 10, and the embodiments of the present disclosure are not limited thereto.

It should be noted that, in the display substrate provided by the embodiment of the present disclosure, the plurality of third pixel circuits included in the plurality of dummy pixel units may all adopt the structure of the second pixel circuit 31 shown in FIGS. 6 and 7, or may all adopt the structure of the second pixel circuit 31 shown in FIGS. 9 and 10, or may also partially adopt the structure of the second pixel circuit 31 shown in FIGS. 6 and 7 and partially adopt the structure of the second pixel circuit 31 shown in FIGS. 9 and 10, and the embodiments of the present disclosure are not limited thereto.

It should be noted that, in the embodiments of the present disclosure, the first voltage terminal VDD may be a high voltage source to output a constant high voltage. The first reset voltage terminal VINT1, the second reset voltage terminal VINT2, and the common voltage terminal VCOM may be low voltage sources to output constant low voltages, and the high and low here only represent the relative magnitude relationship between the input voltages.

It should be noted that in the embodiments of the present disclosure, the value of the first scan signal and the value of the second scan signal may be the same, or, the first scan signal and the second scan signal may be the same scan signal; the value of the first data signal and the value of the second data signal may be the same, or the first data signal and the second data signal may be the same data signal; the value of the first reset control signal and the value of the second reset control signal may be the same, or, the first reset control signal and the second reset control signal may be the same reset control signal; the value of the first reset voltage and the value of the second reset voltage may be the same, or the first reset voltage and the second reset voltage may be the same reset voltage, and the embodiments of the present disclosure do not limit this.

In addition, it should be noted that, in the embodiments of the present disclosure, for example, the plurality of display pixel units may be arranged in Q1 columns, and the plurality of sensing pixel units may be arranged in Q2 columns, where Q1 and Q2 are both positive integers, and for example, Q1 is greater than Q2. In some examples, the Q2 second data signals corresponding to the Q2 columns of display pixel units in the display region may be fixedly or randomly extracted, and the Q2 second data signals are respectively used as Q2 first data signals corresponding to the Q2 columns of sensing pixel units in the sensing region, for example, the Q2 second data signals are in one-to-one correspondence to the Q2 columns of sensing pixel units. In other examples, the first data signal corresponding to each column of sensing pixel units may be an average value (e.g., an arithmetic average value) of a plurality of second data signals corresponding to a plurality of columns of display pixel units (e.g., 10 or 100 columns of display pixel units) in the display region. It should be noted that, in the embodiments of the present disclosure, "second data signal" represents a data signal applied to the display pixel unit, and the values of the second data signals applied to different display pixel units may be different; similarly, "first data signal" represents a data signal applied to the sensing pixel unit, and the values of the first data signals applied to different sensing pixel units may be different.

In the display substrate provided by the embodiment of the present disclosure, except that the second pixel circuit 31 does not include the sensing transistor, the remaining structures of the second pixel circuit 31 are basically the same as or similar to those of the first pixel circuit 21, that is, in the case where the same data signal is written to the first pixel circuit 21 and the second pixel circuit 31, the voltage, which is sensed by the voltage sensor VSENS through the first pixel circuit 21, at the first terminal of the first light emitting element 22 may be equivalent to the voltage at the first terminal of the second light emitting element 32, and therefore, according to the sensed voltage at the first terminal of the first light emitting element 22 and the common voltage provided by the common voltage terminal to which the second terminal of the second light emitting element 32 is connected, the actual voltage difference between the voltage at the first terminal of the second light emitting element 32 and the voltage at the second terminal of the second light emitting element 32 at the current moment can be obtained. According to the current temperature of the display substrate sensed by the temperature sensor and the preset light emitting brightness, the preset voltage difference, corresponding to the preset light emitting brightness at the current temperature of the display substrate, between the voltage at the first terminal of the second light emitting element 32 and the voltage at the second terminal of the second light emitting element 32 can be determined. If the actual voltage difference is different from the preset voltage difference, the magnitude of the common voltage provided by the common voltage terminal can be adjusted to change the actual voltage difference between the voltage at the first terminal of the second light emitting element 32 and the voltage at the second terminal of the second light emitting element 32, so that the actual voltage difference is the same as the preset voltage difference, and thus the light emitting brightness of the second light emitting element 32 corresponds to the current temperature of the display substrate.

An embodiment of the present disclosure further provides another display substrate, the display substrate further includes a light-shielding layer. The light-shielding layer may be at least disposed in the sensing region on the base substrate, and may be located on a side of the plurality of sensing pixel units away from the base substrate, and the light-shielding layer is configured to block light emitted from the sensing pixel unit in the sensing region.

The display substrate provided by the embodiments of the present disclosure improves the optical density (OD) value of the sensing region by providing the light-shielding layer in the sensing region of the display substrate, thereby achieving the effect of shielding light from the sensing region.

FIG. 10 is a schematic block diagram of another display substrate provided by an embodiment of the present disclosure.

As shown in FIG. 10, the display substrate further includes a light-shielding layer 40, the light-shielding layer 40 is disposed in the sensing region 11 together with the plurality of sensing pixel units 20, the light-shielding layer 40 is disposed on the side of the plurality of sensing pixel units 20 away from the base substrate 10, and the light-shielding layer 40 is configured to block the light emitted from the sensing pixel unit 20 in the sensing region 11.

It should be noted that "light emitted from the sensing pixel unit 20 in the sensing region 11" represents light emitted from the sensing region 11 toward a viewing side of the user. For example, the light emitted by the sensing pixel unit 20 in the sensing region 11 includes the light emitted by the first light emitting elements 22 of the plurality of sensing pixel units 20 and the light reflected by the metal layers in the first pixel circuits 21 of the plurality of sensing pixel units 20.

In addition, it should be noted that the display substrate provided by the embodiment of the present disclosure may also be provided with a light-shielding layer in all regions other than the display region 12, that is, the light-shielding layer is also provided in both the sensing region 11 and the dummy region 13. In this case, the light-shielding layer provided in the sensing region 11 is configured to block the light emitted from the sensing pixel unit 20 in the sensing region 11, that is, to block the light emitted by the first light emitting element 22 included in the sensing pixel unit 20 and the light reflected by the metal layer in the first pixel circuit 21 included in the sensing pixel unit 20; the light-shielding layer provided in the dummy region 13 is configured to block the light emitted from the dummy pixel unit in the dummy region 13, that is, to block the light reflected by the metal layer of the third pixel circuit included in the dummy pixel unit.

Figure 11:
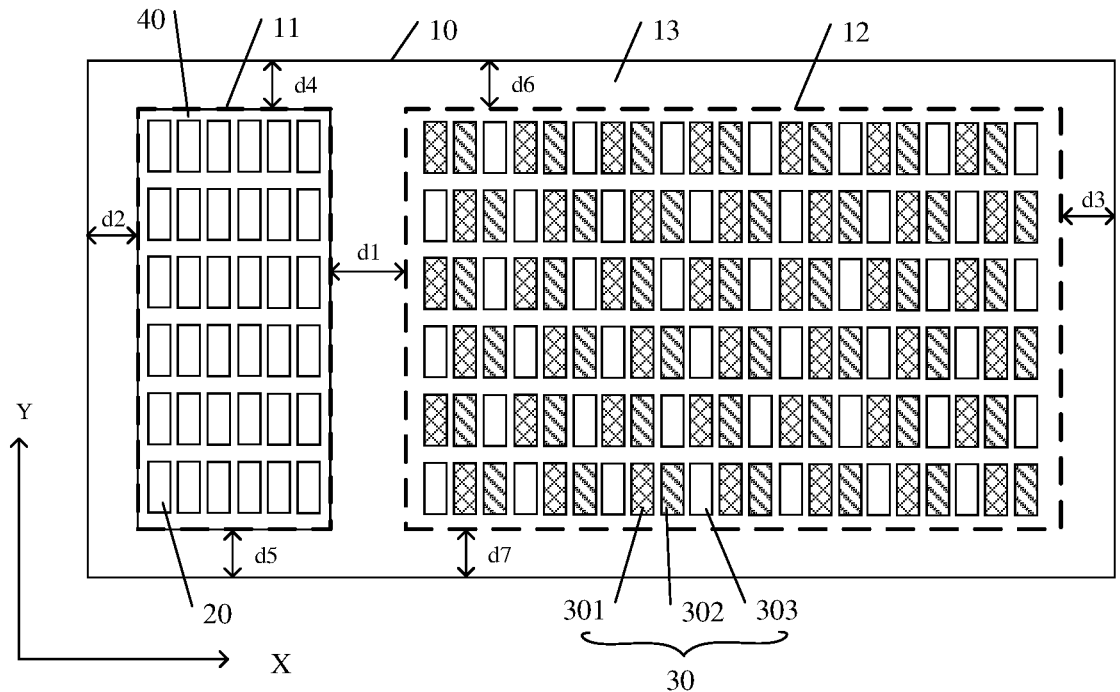
FIG. 11 is a schematic diagram of a planar structure of another display substrate provided by an embodiment of the present disclosure.

FIG. 11 is a schematic view of a planar structure of another display substrate provided by some embodiments of the present disclosure.

As shown in FIG. 11, all regions on the base substrate 10 except for the sensing region and the display region 12 are dummy regions 13. As shown in FIG. 11, the dummy region 13 surrounds the sensing region and the display region 12, and the sensing region and the display region 12 are not in direct contact, for example, the sensing region and the display region 12 are separated by a part of the dummy region 13.

For example, as shown in FIG. 11, the sensing region and the display region 12 are arranged in the first direction X. The second direction Y and the first direction X are perpendicular to each other.

For example, a shape of the display region 12 may be rectangular, and a shape of the sensing region 11 may also be rectangular. Two adjacent edges of the display region 12 are parallel to the first direction X and the second direction Y, respectively, and two adjacent edges of the sensing region 11 are also parallel to the first direction X and the second direction Y, respectively.

For example, the resolution (i.e., size) of the display region 12 may be 2916*1104, that is, in the first direction X, the length of the display region 12 is 2916, and in the second direction Y, the length of the display region 12 is 1104.

For example, the resolution of the sensing region 11 may be 24*1104, that is, in the first direction X, the length of the sensing region 11 is 24, and in the second direction Y, the length of the sensing region 11 is 1104, that is, in the second direction Y, the length of the display region 12 is the same as the length of the sensing region 11.

For example, as shown in FIG. 11, for the dummy region 13, in the first direction X, the length d1 of the portion of the dummy region 13 between the sensing region and the display region 12 may be 6, the length d2 of the portion of the dummy region 13 between the sensing region 11 and the edge of the base substrate 10 (the left edge in FIG. 2) may be 3, and the length d3 of the portion of the dummy region 13 between the display region 12 and the edge of the base substrate 10 (the right edge in FIG. 2) may be 3; in the second direction Y, the length d4 of the portion of the dummy region 13 between the sensing region 11 and the edge of the base substrate 10 (the upper edge in FIG. 2) may be 2, the length d5 of the portion of the dummy region 13 between the sensing region 11 and the edge of the base substrate 10 (the lower edge in FIG. 2) may also be 2, the length d6 of the portion of the dummy region 13 between the display region 12 and the edge of the base substrate 10 (the upper edge in FIG. 2) may be 2, and the length d7 of the portion of the dummy region 13 between the display region 12 and the edge of the base substrate 10 (the lower edge in FIG. 2) may also be 2.

It should be noted that, in the embodiments of the present disclosure, the units of resolution, size, length, etc. are all pixels. For example, the resolution of the display region 12 may be 2916 pixels*1104 pixels.

Figure 12A:
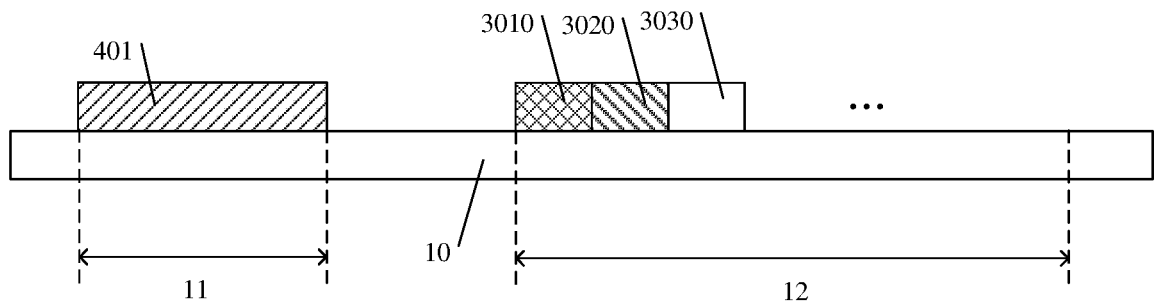
FIG. 12A is a schematic cross-sectional structural diagram of another display substrate provided by an embodiment of the present disclosure.
Figure 12B:
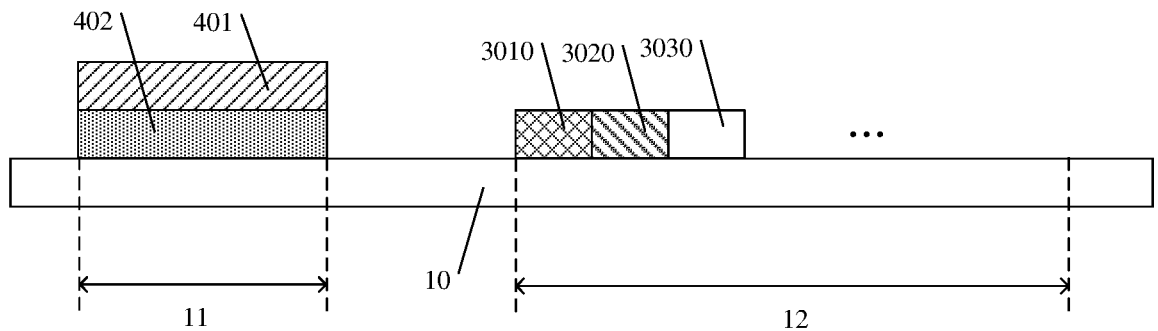
FIG. 12B is another schematic cross-sectional structural diagram of another display substrate provided by an embodiment of the present disclosure.
Figure 12C:
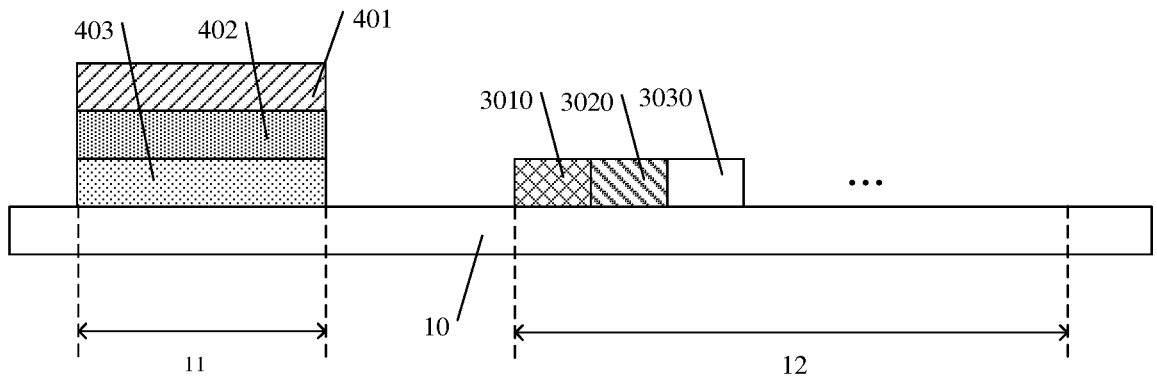
FIG. 12C is still another schematic cross-sectional structural diagram of another display substrate provided by an embodiment of the present disclosure.

FIG. 12A is a schematic cross-sectional structural diagram of another display substrate provided by an embodiment of the disclosure, FIG. 12B is another schematic cross-sectional structural diagram of another display substrate provided by an embodiment of the disclosure, and FIG. 12C is still another schematic cross-sectional structural diagram of another display substrate provided by an embodiment of the present disclosure.

As shown in FIG. 12A, in some embodiments, the light-shielding layer 40 includes a first light-shielding color film layer 401, and an orthographic projection of the first light-shielding color film layer 401 on the base substrate 10 covers the sensing region 11. The shape of the orthographic projection of the first light-shielding color film layer 401 on the base substrate 10 is the same as or substantially the same as the shape of the sensing region 11. In some examples, the sensing region 11 is located within the orthographic projection of the first light-shielding color film layer 401 on the base substrate 10, that is, the size of the orthographic projection of the first light-shielding color film layer 401 on the base substrate 10 is greater than or equal to the size of the sensing region 11. For example, in some examples, the sensing region 11 and the orthographic projections of the first light-shielding color film layer 401 on the base substrate 10 completely overlap each other, so that the shape of the orthographic projection of the first light-shielding color film layer 401 on the base substrate 10 can also be rectangular, and the size of the orthographic projection of the first light-shielding color film layer 401 on the base substrate 10 may be 24*1104.

It should be noted that the shape of the orthographic projection of the first light-shielding color film layer 401 on the base substrate 10 may also be a suitable shape such as a trapezoid. Here, "the shapes being the same or substantially the same" means that both shapes are the same type shape, but does not mean that the ratio of the corresponding sides of one shape and the ratio of the corresponding sides of the other shape are the same. For example, in a case where two shapes are rectangular, the respective aspect ratios of the two shapes may be the same or different, and the embodiments of the present disclosure do not limit this.

Here, in the embodiments of the present disclosure, "orthographic projection" refers to a projection of an element on a plane parallel to the base substrate 10 in a direction perpendicular to the base substrate 10, for example, "orthographic projection of the first light-shielding color film layer 401" refers to the projection of the first light-shielding color film layer 401 on the plane parallel to the base substrate 10 in the direction perpendicular to the base substrate 10.

For example, as shown in FIGS. 11 and 12A, the plurality of display pixel units 30 may include a first display pixel unit 301, and the first display pixel unit 301 includes a first display color film layer 3010. The first light-shielding color film layer 401 and the first display color film layer 3010 have the same color filter characteristics, for example, the first light-shielding color film layer 401 and the first display color film layer 3010 are prepared using the same filter material through the same patterning process, so that the first light-shielding color film layer 401 and the first display color film layer 3010 have the same color filter characteristics, and therefore, the first light-shielding color film layer 401 can be prepared without increasing the manufacturing process, thereby achieving the function of shielding the light from the sensing region 11. In addition, for the example shown in FIG. 12A, because the light-shielding layer 40 includes one first light-shielding color film layer 401, the problem of displaying Mura caused by the color film (CF) process can be avoided or reduced.

For example, in a direction perpendicular to the base substrate 10, the first light-shielding color film layer 401 and the first display color film layer 3010 may have the same thickness.

For example, the side of the first light-shielding color film layer 401 away from the base substrate 10 is the viewing side of the user.

For example, in other examples, as shown in FIG. 12B, the light-shielding layer 40 further includes a second light-shielding color film layer 402. In a direction perpendicular to the base substrate 10, the first light-shielding color film layer 401 is located on the side of the second light-shielding color film layer 402 away from the base substrate 10, that is, the second light-shielding color film layer 402 is located between the first light-shielding color film layer 401 and the base substrate 10.

For example, the orthographic projection of the second light-shielding color film layer 402 on the base substrate 10 covers the sensing region 11. The shape of the orthographic projection of the second light-shielding color film layer 402 on the base substrate 10 is the same as or substantially the same as the shape of the sensing region 11. In some examples, the sensing region 11 is located within the orthographic projection of the second light-shielding color film layer 402 on the base substrate 10, for example, the sensing region 11 and the orthographic projection of the second light-shielding color film layer 402 on the base substrate 10 completely overlap each other, that is, the orthographic projection of the first light-shielding color film layer 401 on the base substrate 10 and the orthographic projection of the second light-shielding color film layer 402 on the base substrate 10 also completely overlap each other, so that the shape of the orthographic projection of the second light-shielding color film layer 402 on the base substrate 10 may also be rectangular, and the size of the orthographic projection of the second light-shielding color film layer 402 on the base substrate 10 may also be 24*1104.

For example, as shown in FIGS. 11 and 12B, the plurality of display pixel units 30 may further include a second display pixel unit 302, and the second display pixel unit 302 includes a second display color film layer 3020. The second light-shielding color film layer 402 and the second display color film layer 3020 have the same color filter characteristics, for example, the second light-shielding color film layer 402 and the second display color film layer 3020 are prepared using the same filter material through the same patterning process, so that the second light-shielding color film layer 402 and the second display color film layer 3020 have the same color filter characteristics, and therefore, the first light-shielding color film layer 401 and the second light-shielding color film layer 402 can be prepared without increasing the manufacturing process, thereby achieving the function of shielding the light from the sensing region 11. Compared to a case of providing only one first light-shielding color film layer 401 in the sensing region 11, providing the first light-shielding color film layer 401 and the second light-shielding color film layer 402 in the sensing region 11 can better shield the sensing region 11 and prevent the sensing region 11 from leaking light.

For example, in the direction perpendicular to the base substrate 10, the second light-shielding color film layer 402 and the second display color film layer 3020 may have the same thickness.

For example, in still other examples, as shown in FIG. 12C, the light-shielding layer 40 may further include a third light-shielding color film layer 403, and in a direction perpendicular to the base substrate 10, the second light-shielding color film layer 402 is located on the side of the third light-shielding color film layer 403 away from the base substrate 10, that is, the third light-shielding color film layer 403 is located between the second light-shielding color film layer 402 and the base substrate 10, and the second light-shielding color film layer 402 is located between the first light-shielding color film layer 401 and the third light-shielding color film layer 403.

For example, the orthographic projection of the third light-shielding color film layer 403 on the base substrate 10 covers the sensing region 11. The shape of the orthographic projection of the third light-shielding color film layer 403 on the base substrate 10 is the same as or substantially the same as the shape of the sensing region 11. In some examples, the sensing region 11 is located within the orthographic projection of the third light-shielding color film layer 403 on the base substrate 10, for example, the sensing region 11 and the orthographic projection of the third light-shielding color film layer 403 on the base substrate 10 completely overlap each other, that is, the orthographic projection of the first light-shielding color film layer 401 on the base substrate 10, the orthographic projection of the second light-shielding color film layer 402 on the base substrate 10, and the orthographic projection of the third light-shielding color film layer 403 on the base substrate 10 completely overlap each other, so that the shape of the orthographic projection of the third light-shielding color film layer 403 on the base substrate 10 may also be rectangular, and the size of the orthographic projection of the third light-shielding color film layer 403 on the base substrate 10 may also be 24*1104.

For example, as shown in FIGS. 11 and 12C, the plurality of display pixel units 30 further include a third display pixel unit 303, and the third display pixel unit 303 includes a third display color film layer 3030. The third light-shielding color film layer 403 and the third display color film layer 3030 have the same color filter characteristics, for example, the third light-shielding color film layer 403 and the third display color film layer 3030 are prepared using the same filter material through the same patterning process, so that the third light-shielding color film layer 403 and the third display color film layer 3030 have the same color filter characteristics, so that the first light-shielding color film layer 401, the second light-shielding color film layer 402, and the third light-shielding color film layer 403 can be prepared without increasing the manufacturing process, thereby achieving the function of shielding the sensing region 11. Compared to a case of providing only one first light-shielding color film layer 401 or providing the first light-shielding color film layer 401 and the second light-shielding color film layer 402 in the sensing region 11, providing the first light-shielding color film layer 401, the second light-shielding color film layer 402, and the third light-shielding color film layer 13 in the sensing region 11 can better shield the sensing region 11 and prevent the sensing region 11 from leaking light.

For example, in the direction perpendicular to the base substrate 10, the third light-shielding color film layer 403 and the third display color film layer 3030 may have the same thickness.

For example, in a direction perpendicular to the base substrate 10, the thickness of the first light-shielding color film layer 401, the thickness of the second light-shielding color film layer 402, and the thickness of the third light-shielding color film layer 13 may all be equal.

For example, the first light-shielding color film layer 401, the second light-shielding color film layer 402, and the third light-shielding color film layer 403 are different color film layers. The first display color film layer 3010, the second display color film layer 3020, and the third display color film layer 3030 are also different color film layers.

For example, the first light-shielding color film layer 401 and the first display color film layer 3010 are color film layers of the same color, the second light-shielding color film layer 402 and the second display color film layer 3020 are color film layers of the same color, and the third light-shielding color film layer 233 and the third display color film layer 3030 are color film layers of the same color. In some examples, both the first light-shielding color film layer 401 and the first display color film layer 3010 are blue color film layers, that is, both the first light-shielding color film layer 401 and the first display color film layer 3010 can block red light, green light, etc., while transmitting blue light; both the second light-shielding color film layer 402 and the second display color film layer 3020 are red color film layers, that is, both the second light-shielding color film layer 402 and the second display color film layer 3020 can block blue light, green light, etc., while transmitting red light; both the third light-shielding color film layer 233 and the third display color film layer 3030 are green color film layers, that is, both the third light-shielding color film layer 233 and the third display color film layer 3030 can block blue light, red light, etc., while transmitting green light.

For another example, in other examples, both the first light-shielding color film layer 401 and the first display color film layer 3010 are blue color film layers, both the second light-shielding color film layer 402 and the second display color film layer 3020 are green color film layers, and both the third light-shielding color film layer 233 and the third display color film layer 3030 are red color film layers.

It should be noted that, in still other examples, both the first light-shielding color film layer 401 and the first display color film layer 3010 may be red color film layers, both the second light-shielding color film layer 402 and the second display color film layer 3020 may be green color film layers, and both the third light-shielding color film layer 233 and the third display color film layer 3030 may be blue color film layers; alternatively, both the first light-shielding color film layer 401 and the first display color film layer 3010 may also be green color film layers, both the second light-shielding color film layer 402 and the second display color film layer 3020 may also be blue color film layers, and both the third light-shielding color film layer 233 and the third display color film layer 3030 may also be red color film layers. The present disclosure does not limit this.

For example, the first light-shielding color film layer 401, the first display color film layer 3010, the second light-shielding color film layer 402, the second display color film layer 3020, the third light-shielding color film layer 233, and the third display color film layer 3030 are all located on a package layer, that is, on a side of the package layer away from the base substrate.

For example, the following will briefly describe the process flows and process conditions for preparing the red color film layer, the blue color film layer, and the green color film layer: first performing a pre-clean operation, and then manually applying glue, such as a red glue, a speed of applying the red glue being 450 rpm/45 seconds (s); pre-baking the red glue for 120 s at a temperature of 85° C.; exposing the red glue after baking (exposure dose is 120 megajoules (mj)); developing the red glue after exposure for 180 s; post-baking the developed red glue for 1800 s at a temperature of 90° C. to obtain a red color film layer; then, applying a glue again, such as blue glue, a speed of applying the blue glue being 1100 rpm/25 s; pre-baking the blue glue for 120 s at a temperature of 85° C.; exposing the baked blue glue (exposure dose is 115 mj); developing the exposed blue glue for 61 s; post-baking the developed blue glue for 1800 s at a temperature of 90° C. to obtain a blue color film layer; finally, applying a glue again, such as green glue, a speed of applying the green glue being 1050 rpm/20 s; pre-baking the green glue for 120 s at a temperature of 85° C.; exposing the baked green glue (exposure dose is 110 mj); developing the exposed green glue for 58 s; post-baking the developed green glue for 1800 s at a temperature of 90° C. to obtain a green color film layer.

Figure 13:
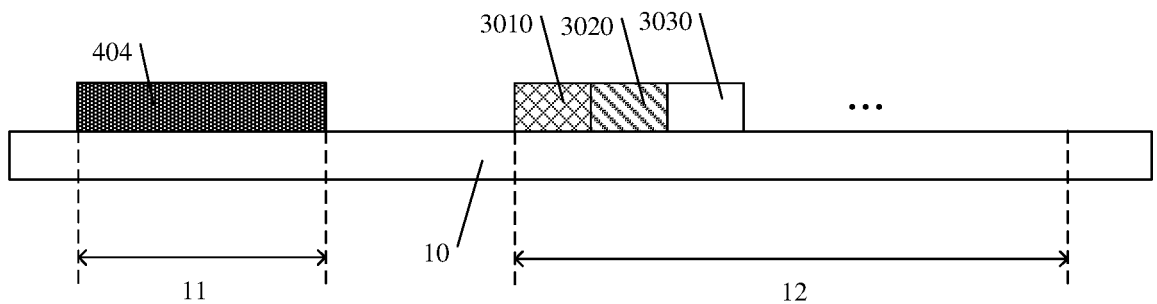
FIG. 13 is another schematic cross-sectional structural diagram of another display substrate provided by an embodiment of the present disclosure.

FIG. 13 is another schematic cross-sectional structural diagram of another display substrate provided by an embodiment of the present disclosure.

For example, as shown in FIG. 13, the light-shielding layer 40 may include a black light-shielding layer 404, and the black light-shielding layer 404 may completely block light emitted from the sensing pixel unit 20 in the sensing region 11. The orthographic projection of the black light-shielding layer 404 on the base substrate 10 covers the sensing region 11. In some examples, the sensing region 11 is located within the orthographic projection of the black light-shielding layer 404 on the base substrate 10, for example, the sensing region 11 and the orthographic projection of the black light-shielding layer 404 on the base substrate 10 completely overlap each other, so that the shape of the orthographic projection of the black light-shielding layer 404 on the base substrate 10 may also be rectangular, and the size of the orthographic projection of the black light-shielding layer 404 on the base substrate 10 may also be 24*1104. Compared with a case of providing a color film layer (e.g., the first light-shielding color film layer 401, the second light-shielding color film layer 402, and the third light-shielding color film layer 403) in the sensing region 11, providing the black light-shielding layer 404 in the sensing region 404 can avoid the Mura problem caused by the manufacturing process of the color film.

For example, the black light-shielding layer 404 may be a black matrix.

For example, the black light-shielding layer 404 may be formed on the base substrate 10 before preparing the first display color film layer 3010, the second display color film layer 3020, and the third display color film layer 3030.

For example, in a direction perpendicular to the base substrate 10, the thickness of the black light-shielding layer 404 may be equal to the thickness of any one of the first display color film layer 3010, the second display color film layer 3020, and the third display color film layer 3030.

Referring again to FIG. 1, each display pixel unit 30 may include the first pixel circuit 31 and the second light emitting element 32, the first pixel circuit 31 is connected to the first terminal of the second light emitting element 32, and is configured to drive the second light emitting element 32 to emit light, and the second light emitting element 32 is configured to emit white light.

For example, the second light emitting element 32 in each display pixel unit 30 cooperates with the display color film layer to emit light of different colors, and the display color film layer may be disposed on the side of the second light emitting element 32 away from the base substrate 10. For example, if the first display color film layer 3010 in the first display pixel unit 301 is a blue color film layer, the white light emitted by the second light emitting element in the first display pixel unit 301 passes through the first display color film layer 3010 to obtain blue light, that is, the first display pixel unit 301 is configured to display blue light. If the second display color film layer 3020 in the second display pixel unit 302 is a red color film layer, the white light emitted by the second light emitting element in the second display pixel unit 302 passes through the second display color film layer 3020 to obtain red light, that is, the second display pixel unit 302 is configured to display red light. If the third display color film layer 3030 in the third display pixel unit 303 is a green color film layer, the white light emitted by the second light emitting element in the third display pixel unit 303 passes through the third display color film layer 3030 to obtain green light, that is, the third display pixel unit 303 is configured to display green light.

For example, as shown in FIG. 11, a plurality of display pixel units 30 are arranged in an array along a first direction X and a second direction Y, the first direction X may be the row direction of the plurality of display pixel units 30, and the second direction Y may be the column direction of the plurality of display pixel units 30.

For example, as shown in FIG. 11, the plurality of display pixel units 30 are arranged in the display region 12 in a BV3 array arrangement. The BV3 array arrangement may indicate that in the first direction X, the arrangement manner of the display pixel units in the odd-numbered pixel unit row is different from the arrangement manner of the display pixel units in the even-numbered pixel unit row. As shown in FIG. 11, for example, in the odd-numbered pixel unit row, the arrangement manner of the display pixel units is BRGBRG (that is, arranged in the manner of the first display pixel unit B, the second display pixel unit R, the third display pixel unit G, the first display pixel unit B, the second display pixel unit R, and the third display pixel unit G); and in the even-numbered pixel unit row, the arrangement manner of the display pixel units is GBRGBR (that is, arranged in the manner of the third display pixel unit, the first display pixel unit, the second display pixel unit, the third display pixel unit, the first display pixel unit, and the second display pixel unit).

For example, as shown in FIG. 11, for the first display pixel unit B, both the first display pixel unit B in a first pixel unit row and the first display pixel unit B in a third pixel unit row are located in the same pixel unit column, both the first display pixel unit B in a second pixel unit row and the first display pixel unit B in a fourth pixel unit row are located in the same pixel unit column, that is, the first display pixel units B in two adjacent pixel unit rows are staggered. As shown in FIG. 11, similar to the first display pixel unit B, the second display pixel units R in two adjacent pixel unit rows are also staggered, and the third display pixel units G in two adjacent pixel unit rows are also staggered. For example, in the first pixel unit row, the arrangement manner of the display pixel units is BRGBRG; in the second pixel unit row, the arrangement manner of the display pixel units is GBRGBR; in the third pixel unit row, the arrangement manner of the display pixel units is BRGBRG; and in the fourth pixel unit row, the arrangement manner of the display pixel units is GBRGBR.

It should be noted that the "arrangement manner" represents the arrangement manner of the display pixel units of different colors.

An embodiment of the present disclosure also provides a display panel including the display substrate provided by any of the foregoing embodiments of the present disclosure.

For example, the display panel may be a rectangular panel, a circular panel, an oval panel, a polygonal panel, or the like. In addition, the display panel can be not only a flat panel, but also a curved panel or even a spherical panel. For example, the display panel may also have a touch function, that is, the display panel may be a touch display panel.

For example, the display panel can be applied to a silicon-based OLED display device. For example, the display panel can be applied to a virtual reality device or an augmented display device. Of course, the display panel can also be applied to other types of display devices, and the embodiments of the present disclosure are not limited thereto.

The display panel provided by the embodiments of the present disclosure has the same or similar beneficial effects as the display substrate provided by the foregoing embodiment of the present disclosure. Because the display substrate has been described in detail in the foregoing embodiment, and similar portions will not be repeated here.

Embodiments of the present disclosure also provide a voltage adjustment method for the display substrate of the foregoing embodiments.

Figure 14:
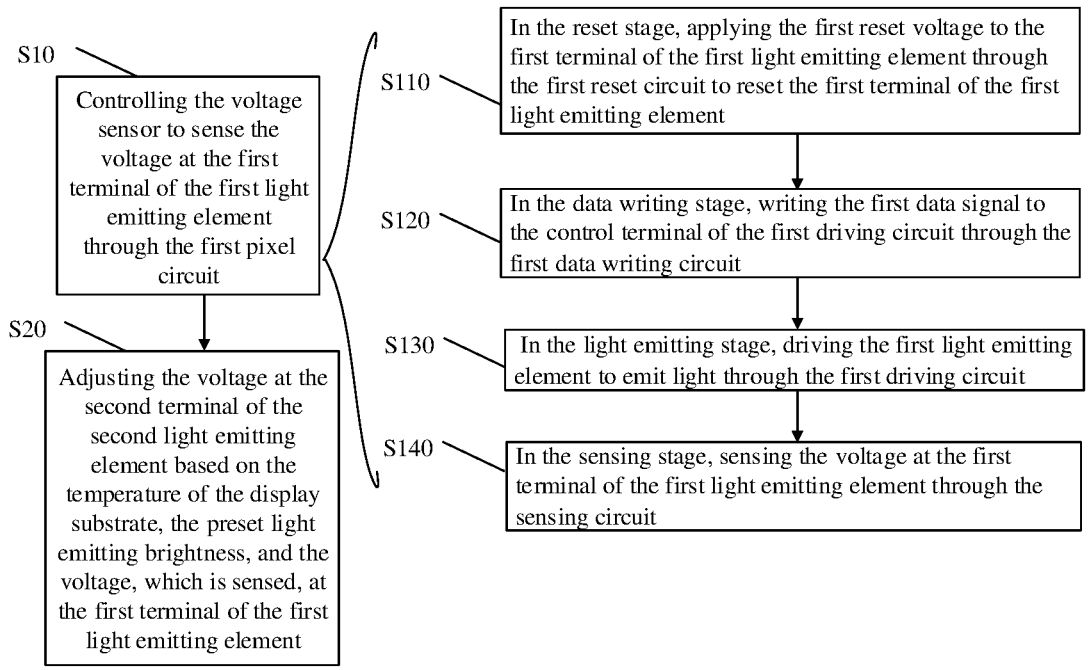
FIG. 14 is a flowchart of a voltage adjustment method for a display substrate provided by an embodiment of the present disclosure.

FIG. 14 is a flowchart of a voltage adjustment method for a display substrate provided by an embodiment of the present disclosure. As shown in FIG. 14, the voltage adjustment method for the display substrate may include:

S10: controlling the voltage sensor to sense the voltage at the first terminal of the first light emitting element through the first pixel circuit.

S20: adjusting the voltage at the second terminal of the second light emitting element based on the temperature of the display substrate, the preset light emitting brightness, and the voltage, which is sensed, at the first terminal of the first light emitting element.

For example, in step S10, sensing the voltage at the first terminal of the first light emitting element through the first pixel circuit may include:

S110: in the reset stage, applying the first reset voltage to the first terminal of the first light emitting element through the first reset circuit to reset the first terminal of the first light emitting element.

S120: in the data writing stage, writing the first data signal to the control terminal of the first driving circuit through the first data writing circuit.

S130: in the light emitting stage, driving the first light emitting element to emit light through the first driving circuit.

S140: in the sensing stage, sensing the voltage at the first terminal of the first light emitting element through the sensing circuit.

For a detailed description and technical effects of the voltage adjustment method for the display substrate provided by the embodiments of the present disclosure, reference may be made to the corresponding description in the embodiments of the display substrate, and details are not repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What are described above is only specific embodiments of the present disclosure, but the scope of protection of the present disclosure is not limited thereto, and the scope of protection of the present disclosure should be based on the protection scope of the claims.

What is claimed is:

1. A display substrate, comprising a base substrate, wherein the base substrate is a silicon substrate and comprises a display region, a sensing region, and a dummy region; at least part of the dummy region is between the display region and the sensing region;
   a plurality of sensing pixel units are provided in the sensing region, at least one of the plurality of sensing pixel units comprises a first light emitting element and a first pixel circuit, and the first pixel circuit is connected to a first terminal of the first light emitting element and a voltage sensor, and is configured to drive the first light emitting element to emit light and control the voltage sensor to sense a voltage at the first terminal of the first light emitting element;
   a plurality of display pixel units are provided in the display region, at least one of the plurality of display pixel units comprises a second pixel circuit and a second light emitting element, and the second pixel circuit is connected to a first terminal of the second light emitting element, and is configured to drive the second light emitting element to emit light to display an image;
   a plurality of dummy pixel units are provided in the dummy region, at least one of the plurality of dummy pixel units comprises a third pixel circuit and a third light emitting element, the third pixel circuit is identical to the second pixel circuit, the third light emitting element is identical to the second light emitting element, and the third pixel circuit is not connected to the third light emitting element; and
   a second terminal of the first light emitting element, a second terminal of the second light emitting element, and a second terminal of the third light emitting element form an integrated structure; the integrated structure is connected to a common voltage terminal and the integrated structure at least covers the display region, the sensing region, and the at least part of the dummy region between the display region and the sensing region.

2. The display substrate according to claim 1, wherein the first pixel circuit comprises a first data writing circuit, a first driving circuit, and a first storage circuit;
   wherein
      the first data writing circuit is connected to a control terminal of the first driving circuit, and is configured to write a first data signal to the control terminal of the first driving circuit under control of a first scan signal;
      a first terminal of the first driving circuit is connected to a first voltage terminal, a second terminal of the first driving circuit is connected to the first terminal of the first light emitting element, and the first driving circuit is configured to drive the first light emitting element to emit light under control of a voltage applied to the control terminal of the first driving circuit; and
      the first storage circuit is connected to the control terminal of the first driving circuit, and is configured to store the first data signal and hold the first data signal at the control terminal of the first driving circuit; and
   the second pixel circuit comprises a second data writing circuit, a second driving circuit, and a second storage circuit;
   wherein
      the second data writing circuit is connected to a control terminal of the second driving circuit, and is configured to write a second data signal to the control terminal of the second driving circuit under control of a second scan signal;
      a first terminal of the second driving circuit is connected to the first voltage terminal, a second terminal of the second driving circuit is connected to the first terminal of the second light emitting element, and the second driving circuit is configured to drive the second light emitting element to emit light under control of a voltage applied to the control terminal of the second driving circuit; and
      the second storage circuit is connected to the control terminal of the second driving circuit, and is configured to store the second data signal and hold the second data signal at the control terminal of the second driving circuit.

3. The display substrate according to claim 2, wherein the first pixel circuit further comprises a first reset circuit; the first reset circuit is connected to the first terminal of the first light emitting element and is configured to apply a first reset voltage to the first terminal of the first light emitting element under control of a first reset control signal to reset the first terminal of the first light emitting element;
   the second pixel circuit further comprises a second reset circuit; the second reset circuit is configured to reset the first terminal of the second light emitting element using a second reset voltage under control of a second reset control signal.

4. The display substrate according to claim 3, wherein the second reset circuit is connected to the first terminal of the second light emitting element, and is configured to apply the second reset voltage to the first terminal of the second light emitting element under control of the second reset control signal to reset the first terminal of the second light emitting element.

5. The display substrate according to claim 3, wherein the second reset circuit is connected to the first terminal of the second driving circuit, and is configured to apply the second reset voltage to the first terminal of the second driving circuit under control of the second reset control signal to reset the first terminal of the second light emitting element through the second driving circuit.

6. The display substrate according to claim 5, wherein the second pixel circuit further comprises a voltage control circuit,
   the voltage control circuit is connected to the first terminal of the second driving circuit, and is configured to apply a first voltage to the first terminal of the second driving circuit under control of a voltage control signal.

7. The display substrate according to claim 3, wherein the first data writing circuit comprises a first data writing transistor, the first driving circuit comprises a first driving transistor, the first storage circuit comprises a first storage capacitor, and the first reset circuit comprises a first reset transistor;
   the control terminal of the first driving circuit comprises a gate electrode of the first driving transistor, the first terminal of the first driving circuit comprises a first electrode of the first driving transistor, and the second terminal of the first driving circuit comprises a second electrode of the first driving transistor;

a gate electrode of the first data writing transistor receives the first scan signal, a first electrode of the first data writing transistor receives the first data signal, and a second electrode of the first data writing transistor is connected to the gate electrode of the first driving transistor;

a first terminal of the first storage capacitor is connected to the gate electrode of the first driving transistor, and a second terminal of the first storage capacitor is connected to the second electrode of the first driving transistor; and a gate electrode of the first reset transistor receives the first reset control signal, a first electrode of the first reset transistor receives the first reset voltage, and a second electrode of the first reset transistor is connected to the second electrode of the first driving transistor.

8. The display substrate according to claim 4, wherein the second data writing circuit comprises a second data writing transistor, the second driving circuit comprises a second driving transistor, the second storage circuit comprises a second storage capacitor, and the second reset circuit comprises a second reset transistor;

the control terminal of the second driving circuit comprises a gate electrode of the second driving transistor, the first terminal of the second driving circuit comprises a first electrode of the second driving transistor, and the second terminal of the second driving circuit comprises a second electrode of the second driving transistor;

a gate electrode of the second data writing transistor receives the second scan signal, a first electrode of the second data writing transistor receives the second data signal, and a second electrode of the second data writing transistor is connected to the gate electrode of the second driving transistor;

a first terminal of the second storage capacitor is connected to the gate electrode of the second driving transistor, and a second terminal of the second storage capacitor is connected to the second electrode of the second driving transistor; and a gate electrode of the second reset transistor receives the second reset control signal, a first electrode of the second reset transistor receives the second reset voltage, and a second electrode of the second reset transistor is connected to the second electrode of the second driving transistor.

9. The display substrate according to claim 6, wherein the second data writing circuit comprises a second data writing transistor, the second driving circuit comprises a second driving transistor, the second storage circuit comprises a second storage capacitor, the second reset circuit comprises a second reset transistor, and the voltage control circuit comprises a voltage control transistor;

the control terminal of the second driving circuit comprises a gate electrode of the second driving transistor, the first terminal of the second driving circuit comprises a first electrode of the second driving transistor, and the second terminal of the second driving circuit comprises a second electrode of the second driving transistor;

a gate electrode of the second data writing transistor receives the second scan signal, a first electrode of the second data writing transistor receives the second data signal, and a second electrode of the second data writing transistor is connected to the gate electrode of the second driving transistor;

a first terminal of the second storage capacitor is connected to the gate electrode of the second driving transistor, and a second terminal of the second storage capacitor is connected to a ground terminal;

a gate electrode of the second reset transistor receives the second reset control signal, a first electrode of the second reset transistor receives the second reset voltage, and a second electrode of the second reset transistor is connected to the first electrode of the second driving transistor; and a gate electrode of the voltage control transistor receives the voltage control signal, a first electrode of the voltage control transistor receives the first voltage, and a second electrode of the voltage control transistor is connected to the first electrode of the second driving transistor.

10. The display substrate according to claim 1, wherein the first pixel circuit comprises a sensing circuit;

the sensing circuit is connected to the first terminal of the first light emitting element, and is configured to control the voltage sensor to sense the voltage at the first terminal of the first light emitting element under control of a sensing control signal.

11. The display substrate according to claim 10, wherein the sensing circuit comprises a sensing transistor, a gate electrode of the sensing transistor receives the sensing control signal, a first electrode of the sensing transistor is connected to the voltage sensor, and a second electrode of the sensing transistor is connected to the first terminal of the first light emitting element.

12. The display substrate according to claim 1, wherein the sensing region, the at least part of the dummy region, and the display region are sequentially arranged along a first direction;

in the first direction, a size of the sensing region is between a size of the display region and a size of the at least part of the dummy region.

13. The display substrate according to claim 1, further comprising an adjustment circuit, wherein the adjustment circuit is configured to adjust a voltage provided by the common voltage terminal based on the voltage, which is sensed, at the first terminal of the first light emitting element, a temperature of the display substrate, and a preset light emitting brightness.

14. The display substrate according to claim 1, further comprising a light-shielding layer, wherein the light-shielding layer is at least disposed in the sensing region, and the light-shielding layer is on a side of the plurality of sensing pixel units away from the base substrate, and the light-shielding layer is configured to block light emitted from the plurality of sensing pixel units in the sensing region.

15. The display substrate according to claim 14, wherein the light-shielding layer comprises a first light-shielding color film layer, a second light-shielding color film layer, and a third light-shielding color film layer, in a direction perpendicular to the base substrate, the first light-shielding color film layer, the second light-shielding color film layer, and the third light-shielding color film layer are sequentially arranged on a side away from the base substrate, an orthographic projection of an overlapping region of the first light-shielding color film layer, the second light-shielding color film layer, and the third light-shielding color film layer on the base substrate covers the sensing region;

the plurality of display pixel units comprise a first display pixel unit, a second display pixel unit, and a third display pixel unit, the first display pixel unit comprises a first display color film layer, the second display pixel unit comprises a second display color film layer, and the third display pixel unit comprises a third display color film layer, the first light-shielding color film layer and the first display color film layer have same color filter characteristics, the second light-shielding color film layer and the second display color film layer have same color filter characteristics, and the third light-shielding color film layer and the third display color film layer have same color filter characteristics.

16. The display substrate according to claim 14, wherein the light-shielding layer comprises a black light-shielding layer, and in a direction perpendicular to the base substrate, an orthographic projection of the black light-shielding layer on the base substrate covers the sensing region.

17. The display substrate according to claim 14, wherein the light-shielding layer is further provided in the dummy region, the light-shielding layer is on a side of the plurality of dummy pixel units away from the base substrate, and the light-shielding layer is configured to block light emitted from the plurality of dummy pixel units of the dummy region.

18. The display substrate according to claim 1, wherein the first light emitting element is identical to or different from the second light emitting element; and the first pixel circuit is identical to or different from the second pixel circuit.

19. A display panel, comprising a display substrate, wherein the display substrate comprises a base substrate, the base substrate is a silicon substrate and comprises a display region, a sensing region, and a dummy region; at least part of the dummy region is between the display region and the sensing region;

a plurality of sensing pixel units are provided in the sensing region, at least one of the plurality of sensing pixel units comprises a first light emitting element and a first pixel circuit, and the first pixel circuit is connected to a first terminal of the first light emitting element and a voltage sensor, and is configured to drive the first light emitting element to emit light and control the voltage sensor to sense a voltage at the first terminal of the first light emitting element;

a plurality of display pixel units are provided in the display region, at least one of the plurality of display pixel units comprises a second pixel circuit and a second light emitting element, and the second pixel circuit is connected to a first terminal of the second light emitting element, and is configured to drive the second light emitting element to emit light to display an image;

a plurality of dummy pixel units are provided in the dummy region, at least one of the plurality of dummy pixel units comprises a third pixel circuit and a third light emitting element, the third pixel circuit is identical to the second pixel circuit, the third light emitting element is identical to the second light emitting element, and the third pixel circuit is not connected to the third light emitting element; and a second terminal of the first light emitting element, a second terminal of the second light emitting element, and a second terminal of the third light emitting element form an integrated structure; the integrated structure is connected to a common voltage terminal and the integrated structure at least covers the display region, the sensing region, and the at least part of the dummy region between the display region and the sensing region.

20. The display panel of claim 19, wherein the display substrate further comprises an adjustment circuit, the adjustment circuit is configured to adjust a voltage provided by the common voltage terminal based on the voltage, which is sensed, at the first terminal of the first light emitting element, a temperature of the display substrate, and a preset light emitting brightness.

* * * * *